United States Patent
Okuno et al.

[11] Patent Number: 6,165,822
[45] Date of Patent: Dec. 26, 2000

[54] SILICON CARBIDE SEMICONDUCTOR DEVICE AND METHOD OF MANUFACTURING THE SAME

[75] Inventors: Eiichi Okuno, Motosu-gun; Takeshi Endo, Toyoake; Shinji Amano, Okazaki, all of Japan

[73] Assignee: Denso Corporation, Kariya, Japan

[21] Appl. No.: 09/224,351

[22] Filed: Jan. 4, 1999

[30] Foreign Application Priority Data

| Jan. 5, 1998 | [JP] | Japan | 10-000378 |
|---|---|---|---|
| May 20, 1998 | [JP] | Japan | 10-138848 |
| May 15, 1998 | [JP] | Japan | 10-133605 |
| Oct. 26, 1998 | [JP] | Japan | 10-304089 |

[51] Int. Cl.$^7$ .......................... H01L 21/335; H01L 21/338
[52] U.S. Cl. ........................ 438/142; 438/167; 438/197; 438/404; 438/414
[58] Field of Search ................... 438/142, 167, 438/197, 404, 407, 414, 423, 431

[56] References Cited

U.S. PATENT DOCUMENTS

| 4,994,413 | 2/1991 | Eshita | 437/244 |
|---|---|---|---|
| 5,323,040 | 6/1994 | Baliga . | |
| 5,459,107 | 10/1995 | Palmour . | |
| 5,506,421 | 4/1996 | Palmour . | |
| 5,543,637 | 8/1996 | Baliga | 257/77 |
| 5,597,744 | 1/1997 | Kamiyama et al. | 437/40 |
| 5,612,260 | 3/1997 | Palmour . | |
| 5,629,531 | 5/1997 | Palmour . | |
| 5,681,762 | 10/1997 | Baliga . | |
| 5,744,826 | 4/1998 | Takeuchi et al. | 257/777 |
| 5,773,849 | 6/1998 | Harris . | |
| 5,776,837 | 7/1998 | Palmour . | |
| 5,950,076 | 9/1999 | Baliga | 438/142 |
| 6,020,600 | 2/2000 | Miyajima et al. | 257/76 |

FOREIGN PATENT DOCUMENTS

| 5-259443 | 10/1993 | Japan . |
|---|---|---|
| 9-74193 | 3/1997 | Japan . |

*Primary Examiner*—Richard Elms
*Assistant Examiner*—Michael S. Lebentritt
*Attorney, Agent, or Firm*—Pillsbury Madison & Sutro LLP

[57] ABSTRACT

A vertical type power MOSFET made of silicon carbide includes a surface channel layer doped with nitrogen as dopant with a concentration equal to or less than $1 \times 10^{15}$ cm$^{-3}$. Accordingly, when a gate oxide film is formed on the surface channel layer, an amount of silicon nitride produced in the gate oxide film and at the interface between the gate oxide film and the surface channel layer becomes extremely small. As a result, carrier traps are prevented from being produced by silicon nitride, resulting in stable FET characteristics and high reliability to the gate oxide film.

10 Claims, 24 Drawing Sheets

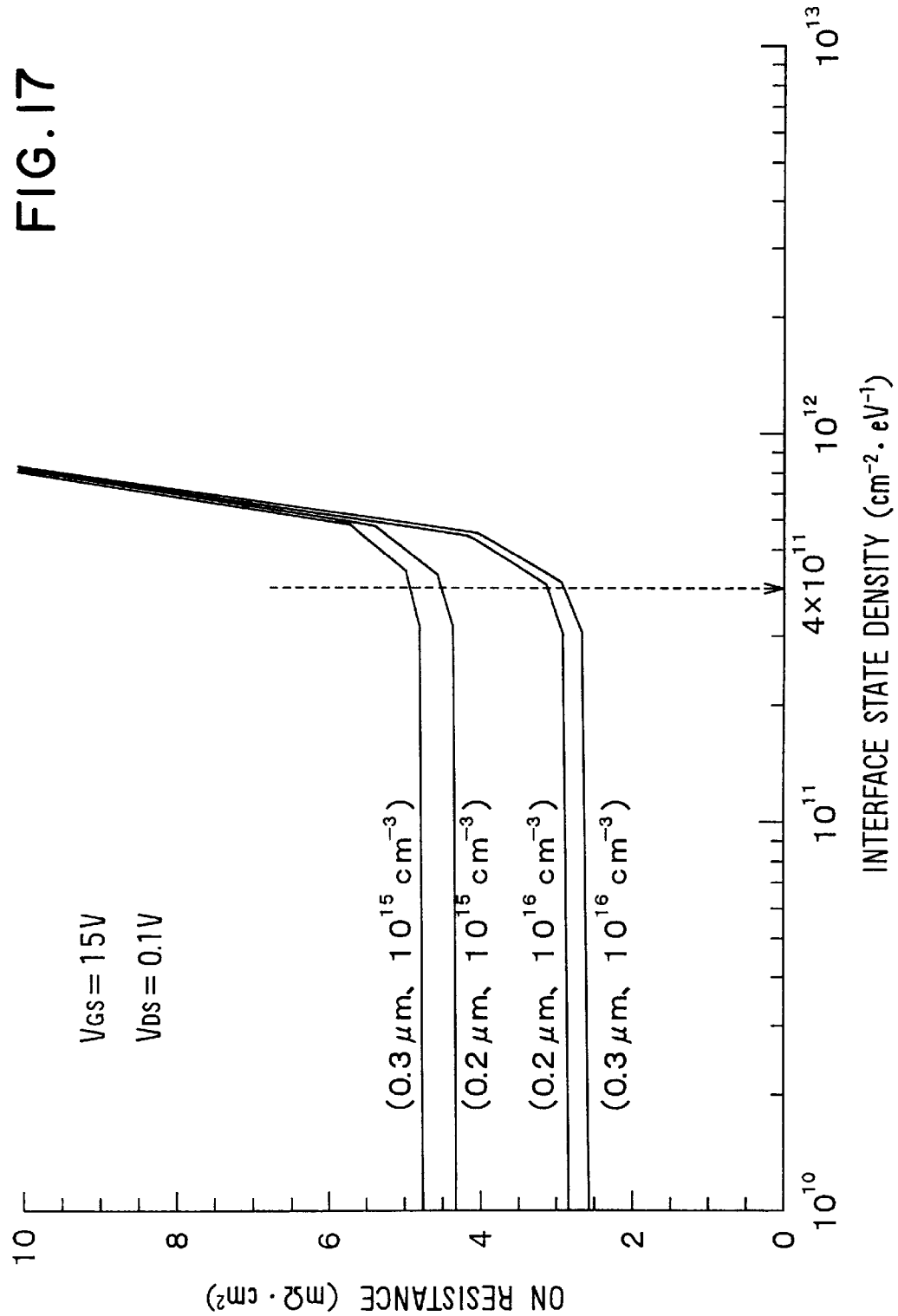

SILICON CARBIDE SEMICONDUCTOR DEVICE AND METHOD OF MANUFACTURING THE SAME

CROSS REFERENCE TO RELATED APPLICATIONS

This application is based upon and claims the benefit of the prior Japanese Patent Applications No. 10-378, filed on Jan. 5, 1998, No. 10-133605 filed on May 15, 1998, No. 10-138848 filed on May 20, 1998, and No. 10-304089, filed on Oct. 26, 1998, the contents of which are incorporated herein by reference.

BACKGROUND OF THE INVENTION

1. Field of the Invention

This invention relates to a silicon carbide semiconductor device, especially to an insulated gate type field effect transistor such as a high-power vertical MOSFET, and a method of manufacturing the same.

2. Description of the Related Art

The applicant of the present invention proposes in pending U.S. patent application Ser. No. 09/035,204 a planar-type MOSFET for improving channel mobility and for lowering ON-resistance. Referring to FIG. 1, the planar-type MOSFET includes an n$^+$ type semiconductor substrate 1 made of silicon carbide (SiC) and having a main surface 1a and a back surface 1b on a side opposite to the main surface 1a. An n$^-$ type epitaxial layer (herebelow, referred to as n$^-$ epi-layer) 2 is formed on the main surface 1a of the n$^+$ type semiconductor substrate 1 to have a dopant (impurity) concentration lower than that of the substrate 1. In specific surface regions of the n$^-$ type epi-layer 2, p$^-$ type base regions 3a, 3b are formed at a specific depth to be separated from one another. In specific surface regions of the p$^-$ type base regions 3a, 3b, n$^+$ type source regions 4a, 4b are formed at a depth shallower than that of the base regions 3a, 3b.

An n$^-$ type SiC layer 5 is extended in surface regions of the n$^-$ type epi-layer 2 and the p$^-$ type base regions 3a, 3b, between the n$^+$ type source regions 4a, 4b, thereby connecting the source regions 4a, 4b and the n$^-$ type epi-layer 2 via the surface regions of the p$^-$ type base regions 3a, 3b. The n$^-$ type SiC layer 5 is formed through epitaxial growth to have 4H, 6H, or 3C type crystal structure. When the device is operated, the n$^-$ type SiC layer 5 functions as a channel formation layer. Herebelow, the n$^-$ type SiC layer 5 is referred to as a surface channel layer. The surface channel layer 5 is doped with nitrogen (N) as dopant, with a low dopant concentration, for example, in a range of $1\times10^{15}$ cm$^{-3}$ to $1\times10^{17}$ cm$^{-3}$ which is generally less than the dopant concentrations of the n$^-$ type epi-layer 2 and the p$^-$ type base regions 3a, 3b. Accordingly, low ON-resistance is realized.

A gate oxide film 7 is formed from silicon dioxide (SiO$_2$) on the surface channel layer 5 and the n$^+$ type source regions 4a, 4b, and a gate electrode 8 is further formed on the gate oxide film 7. The gate electrode 8 is covered with an insulation film 9. The insulation film 9 is made of LTO (Low Temperature Oxide). A source electrode 10 is formed on the insulation film 9 to contact the n$^+$ type source regions 4a, 4b and p$^-$ type base regions 3a, 3b. A drain electrode layer 11 is formed on the back surface 1b of the n$^+$ type semiconductor substrate 1.

The thus constructed planar-type MOSFET operates at an accumulation mode in which a channel region is induced without inverting the conductive type of the channel formation layer. Therefore, the channel mobility can be increased and the ON-resistance can be lowered as compared with those of an inversion mode MOSFET which is accompanied by inversion of the conductive type to form a channel.

The inventors of the present invention manufactured the planar-type power MOSFET described above, and examined the gate oxide film 7 of the MOSFET by means of light illumination C-V measurement. The resultant C-V characteristic is shown in FIG. 2. As a result, it was founded that the C-V characteristic was largely varied by illumination, and after that it did not recover immediately. That is, it was founded that the C-V characteristic had the so-called hysteresis characteristic. In addition, a flat-band voltage was shifted to a positive side. This implies that electron traps arose.

This phenomenon indicates that carrier traps exist in the gate oxide film or at an interface between the gate oxide film and the surface channel layer 5 (SiO$_2$/SiC interface), and can cause not only instability of FET characteristics but deterioration in reliability to the gate oxide film 7.

SUMMARY OF THE INVENTION

The present invention has been made in view of the above problem. An object of the present invention is to provide a MOSFET having stable FET characteristics and high reliability to a gate insulation film thereof.

The inventors of the present invention have studied concerning the problem described above, and found that Si-N bonds existed at the SiO$_2$/SiC interface as a result of XPS measurement setting detector angle θ to 5° as shown in FIG. 3. That is, nitrogen used as dopant for the surface channel layer 5 shown in FIG. 1 reacts with silicon carbide during a thermal oxidation treatment for forming the gate oxide film 7 so as to produce silicon nitride (SiN) which can cause carrier (electron or hole) traps.

Therefore, according to a first aspect of the present invention, a surface channel layer includes nitrogen with a concentration of equal to or less than $1\times10^{15}$ cm$^{-3}$. Accordingly, an amount of silicon nitride existing in a gate insulation film and at an interface between the surface channel layer and the gate insulation film becomes so extremely small that the carrier trap concentration is negligibly small, resulting in stable FET characteristics and improved reliability to the gate insulation film.

According to a second aspect of the present invention, the surface channel layer includes an element as dopant selected from the fifteenth group elements other than nitrogen in the periodic table. In this case, the concentration of the dopant in the surface channel layer is in a range of $1\times10^{15}$ cm$^{-3}$ to $1\times10^{17}$ cm$^{-3}$. The concentration of the unintendedly doped nitrogen should be equal to or less than $1\times10^{15}$ cm$^{-3}$. As a result, the amount of silicon nitride existing in the gate insulation film and at the interface between the surface channel layer and the gate insulation film becomes so extremely small that the carrier trap concentration is negligibly small.

Preferably, an interface state density at the interface between the gate insulation film and the surface channel layer is controlled to be equal to or less than $4\times10^{11}$ cm$^{-2}$ eV$^{-1}$. Accordingly, the stability of the FET characteristics is further improved without increasing ON resistance.

According to a third aspect of the present invention, after the gate insulation film is formed, a high temperature annealing treatment is carried out at a temperature equal to or higher than 1200° C. Si-N bonds capable of causing carrier traps are decomposed during the high temperature annealing treatment. The high temperature annealing treatment is preferably performed in ambience including at least one of hydrogen, oxygen and an inert gas. Consequently, even when the concentration of nitrogen in the surface channel layer is larger than $1 \times 10^{15}$ cm$^{-3}$, the amount of silicon nitride is sufficiently reduced, resulting in stable FET characteristics and improved reliability to the gate insulation film.

According to a fourth aspect of the present invention, after the gate oxide film is formed by thermally oxidizing a surface portion of the surface channel layer at a first temperature, a reoxidation treatment is performed in oxidation ambience at a second temperature lower than the first temperature. Further, annealing is performed at an oxidation rate smaller than that in the reoxidation treatment.

In this case, Si-N bonds taken into the gate insulation film during the reoxidation treatment performed at a large oxidation rate can be decomposed by reacting with oxygen during the annealing performed at an extremely small oxidation rate. As a result, the carrier traps caused by Si-N bonds are reduced, resulting in stable FET characteristics and improved reliability to the gate insulation film. The oxidation rate in the annealing is preferably equal to or less than 0.8 nm/h, which is nearly equal to the oxidation rate of the reoxidation treatment. The temperature of the annealing is preferably equal to that of the reoxidation treatment. Accordingly, a manufacturing process becomes simple.

BRIEF DESCRIPTION OF THE DRAWINGS

Other objects and features of the present invention will become more readily apparent from a better understanding of the preferred embodiments described below with reference to the following drawings.

FIG. 17 is a graph showing relationships between ON resistances and interface state densities;

DETAILED DESCRIPTION OF THE PREFERRED EMBODIMENTS

Figure 1:
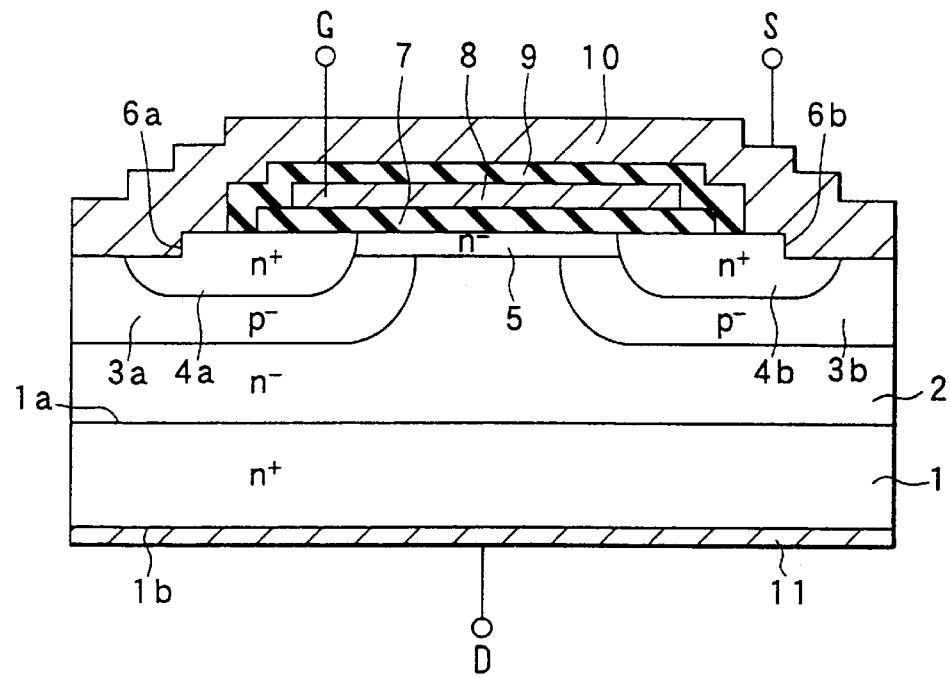
FIG. 1 is a cross-sectional view showing a vertical power MOSFET proposed by the applicant of the present invention in a pending U.S. Patent Application.
Figure 2:
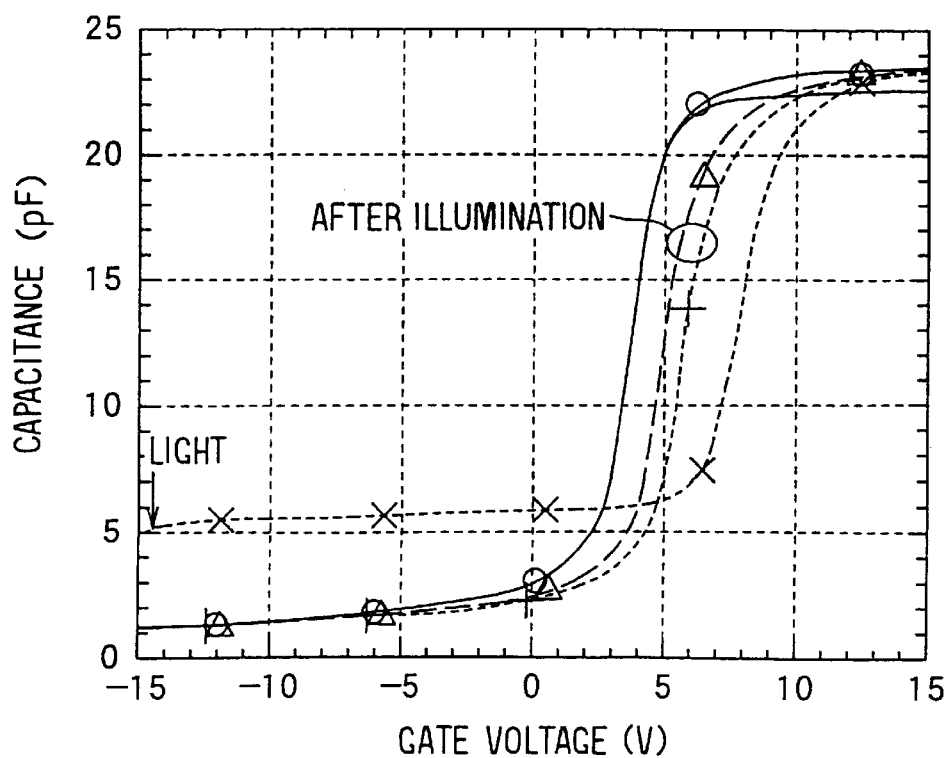
FIG. 2 is a chart showing characteristics of the vertical power MOSFET shown in FIG. 1.
Figure 3:
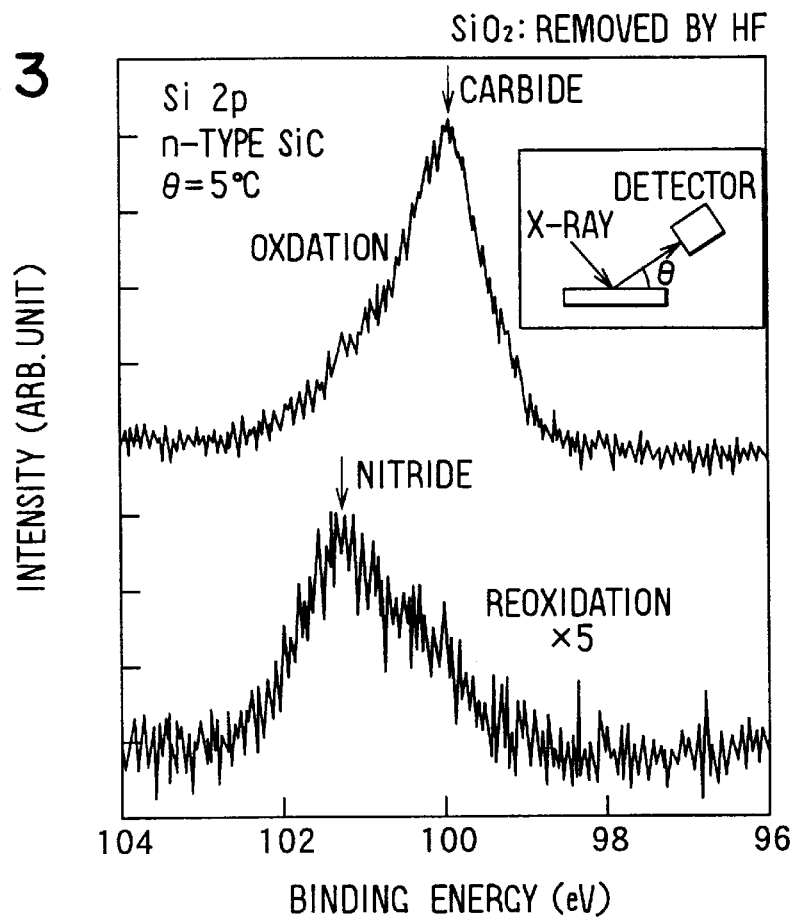
FIG. 3 is a chart showing an XPS measurement result of the vertical power MOSFET shown in FIG. 1.

Herebelow, preferred embodiments according to the present invention will be explained referring to the drawings.

First Embodiment

A normally OFF and n channel planar-type MOSFET (vertical power MOSFET) in a first preferred embodiment is suitable for an inverter, a rectifier of an automotive alternator and the like. The structure of the vertical power MOSFET will be explained with reference to FIG. 4, focusing on points different from those of the MOSFET shown in FIG. 1. The same parts as those of the MOSFET shown in FIG. 1 are indicated by the same reference numerals and the same explanation will be omitted.

Figure 4:
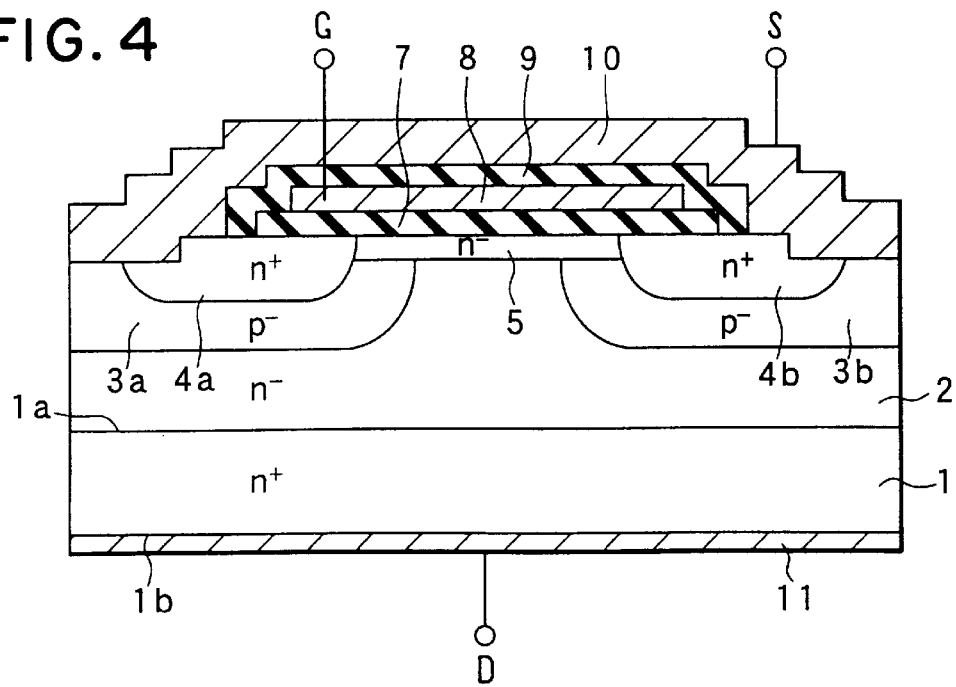
FIG. 4 is a cross-sectional view showing a vertical power MOSFET in first to fourth preferred embodiments of the present invention.

When the vertical power MOSFET shown in FIG. 4 is compared with the MOSFET shown in FIG. 1, the point that nitrogen is used as dopant of the surface channel layer 5 is the same; however, the impurity concentrations in the surface channel layers 5 are different from one another. That is, while the impurity concentration in the surface channel layer 5 in the MOSFET shown in FIG. 1 is in a range of approximately $1 \times 10^{15}$ cm$^{-3}$ to $1 \times 10^{17}$ cm$^{-3}$, the impurity concentration of the surface channel layer 5 in the MOSFET shown in FIG. 4 is equal to or less than $1 \times 10^{15}$ cm$^{-3}$. Further, an amount of silicon nitride existing in the gate oxide layer 7 and at the interface between the gate oxide film 7 and the surface channel layer 5 is extremely small. Therefore, in the vertical power MOSFET in this embodiment, electron or hole traps are hardly caused by silicon nitride, resulting in stable MOSFET characteristics.

Next, a manufacturing process of the vertical type MOSFET shown in FIG. 4 will be explained referring to FIGS. 5A–5C, 6A–6C, and 7A–7C.

Figure 5A:
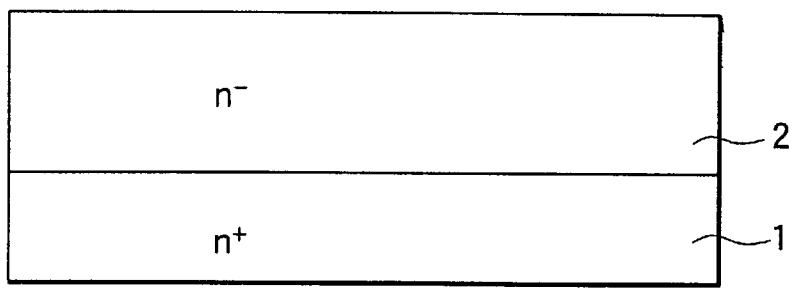
FIGS. 5A–5C, 6A–6C, and 7A–7C are cross-sectional views showing a process of manufacturing the vertical power MOSFET shown in FIG. 4 in a stepwise manner.

Step shown in FIG. 5A

First, n-type 4H, 6H, or 3C-SiC substrate is prepared as the n+ type semiconductor substrate 1. The n+ type semiconductor substrate 1 has a thickness of 400 μm and the main surface 1a corresponding to a (0001) Si plane or a (11 20̄)a plane. The n− type epi-layer 2 is epitaxially grown on the main surface 1a of the substrate 1 to have a thickness of 5 μm. Accordingly, the n− type epi-layer 2 has the same crystal structure as that of the underlying substrate 1 so that it becomes an N-type 4H, 6H, or 3C-SiC layer.

Figure 5B:
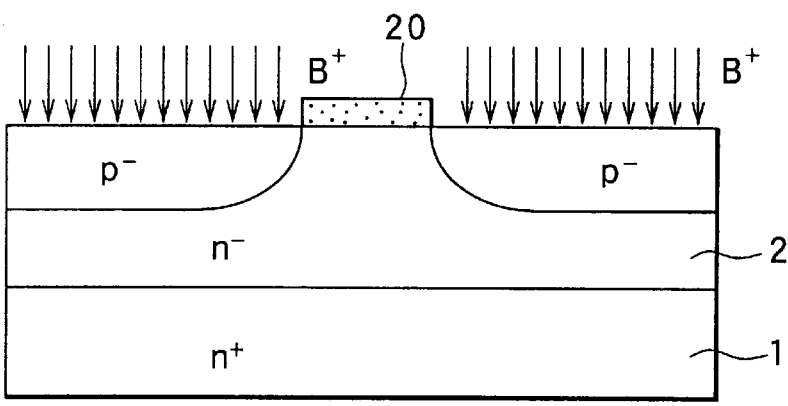

Step shown in FIG. 5B

An LTO film 20 is disposed on a specific region of the n− type epi-layer 2, and boron (or aluminum) ions (B+) are implanted into the n− type epi-layer 2 using the LTO film 20 as a mask, so that the p− type base regions 3a, 3b are formed. As ion implantation conditions, a temperature is 700° C. and a dose is 1×10$^{16}$ cm$^{-2}$.

Figure 5C:
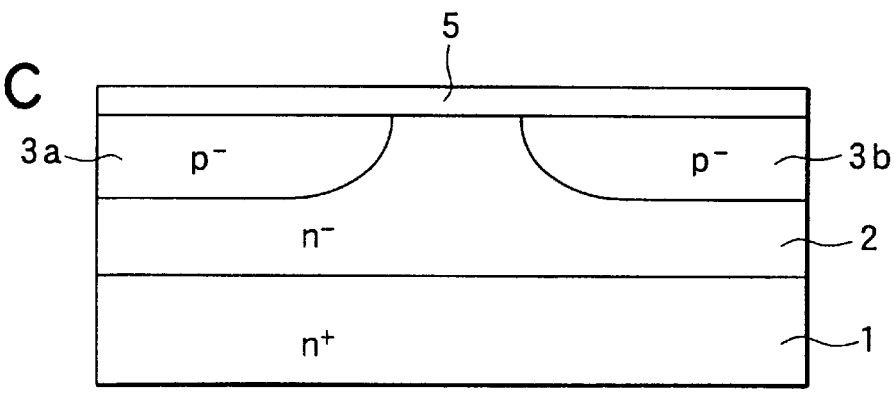

Step shown in FIG. 5C

After the LTO film 20 is removed, the surface channel layer 5 is epitaxially grown on the n− type epi-layer 2 including the p− type base regions 3a, 3b by a chemical vapor deposition (CVD) method. At that time, the dose is controlled so that the nitrogen concentration in the surface channel layer 5 becomes equal to or less than 1×10$^{15}$ cm$^{-3}$. This epitaxial growth step will be explained in more detail using a growth unit 50 shown in FIG. 8.

Figure 8:
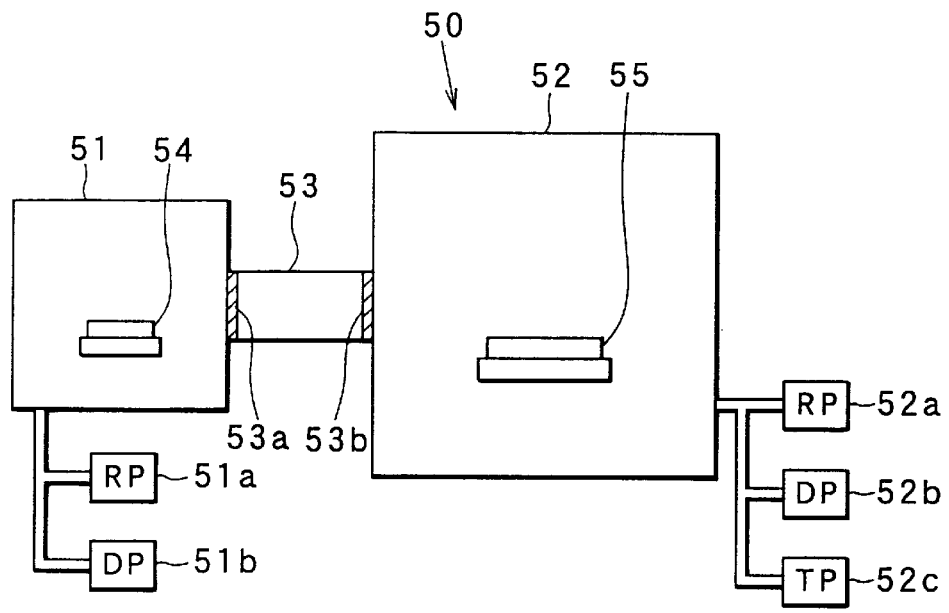
FIG. 8 is a schematic view showing a growth system used for epitaxial growth in the first embodiment.

As shown in FIG. 8, the growth unit 50 includes a preliminary chamber 51, a high vacuum growth apparatus 52 such as a molecular beam epitaxial growth (MBE) apparatus, a CVD apparatus, or the like, and a connection part 53 connecting the preliminary chamber 51 and a high vacuum growth apparatus 52. The preliminary chamber 51 is equipped with pumps such as a rotary pump (RP) 51a and a diffusion pump (DP) 51b, and is made to be a high vacuum in a range of 10$^{-6}$ Torr to 10$^{-15}$ Torr by the pumps. A silicon carbide seed crystal 54 for the crystal growth is disposed in the preliminary chamber 51.

The material (silicon carbide in this embodiment), which is to be grown, is heated to sublimate in an ultra-high vacuum, or source gas is introduced into the high vacuum apparatus 52, so that a chemical reaction occurs on an entire surface of a wafer 55 in the high vacuum apparatus 52. As a result, a single crystal layer is grown on the wafer 55. The high vacuum apparatus 52 is equipped with pumps such as a rotary pump 52a, a diffusion pump 52b, a turbo-pump (TB) 52c, and the like, and is made to be the ultra-high vacuum in a range of 10$^{-6}$ Torr to 10$^{-15}$ Torr by the pumps. Windows 53a, 53b hermetically sealed with packing members are provided between the preliminary chamber 51 and the connection part 53 and between the high vacuum growth apparatus 52 and the connection part 53, respectively, to allow communication therebetween or to shut down therebetween.

The seed crystal (substrate) 54 on which an epitaxial layer is to be formed is disposed in the preliminary chamber 51 of the thus constructed growth unit 50. Then, the preliminary chamber 51 is made to be the high vacuum so that nitrogen attached to the substrate 54 is removed. At that time, the inside of the high vacuum growth apparatus 52 is kept at the ultra-high vacuum. After that, the window 53a is opened, and the substrate 54 is transported to the connection part 53. After the window 53a is closed, the window 53b is opened and the substrate 54 is transported into the high vacuum growth apparatus 52. Successively, after the substrate 54 is disposed at a specific position, the window 53b is closed to secure the air-tightness inside the high vacuum growth apparatus 52.

In this way, the substrate is held in the high vacuum within the preliminary chamber 51, while the inside of the high vacuum growth apparatus 52 in which the epitaxial growth is to be carried out is kept at the ultra-high vacuum. Therefore, the ultra-high vacuum inside the high vacuum growth apparatus 52 is always kept, and remaining nitrogen in the high vacuum growth apparatus 52 can be effectively removed. After that, the surface channel layer 5 is grown by the sublimation method, the CVD method, or the like described above. In the growing, the pressure in the chamber should be changed by the source gas and carrier gas. When the substrate is transported to the connection part 53, the pressure should be in a range of 10$^{-6}$ Torr to 10$^{-15}$ Torr. Accordingly, the surface channel layer 5 can be formed with low nitrogen concentration equal to or less than 1×10$^{15}$ cm$^{-3}$.

Figure 9:
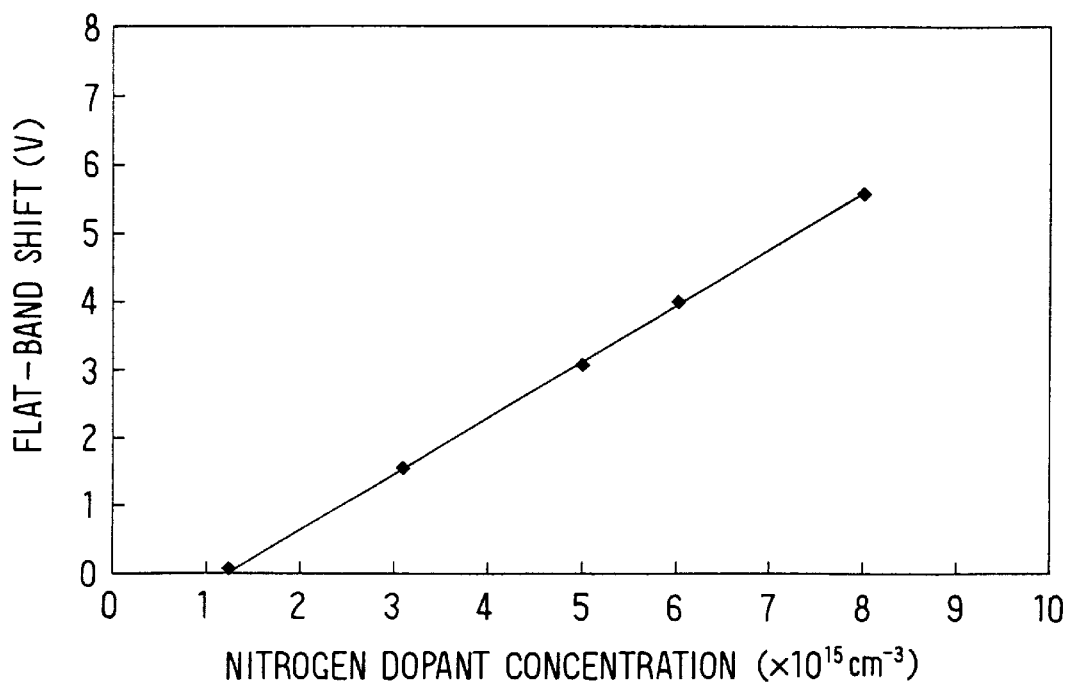
FIG. 9 is a graph showing a relationship between flat-band shift voltages and nitrogen concentrations.

For example, when the surface channel layer 5 is grown by the CVD method, SiH$_4$ gas and C$_3$H$_8$ gas are supplied into the apparatus together with an extremely small amount of N$_2$ gas to grow SiC. When nitrogen remains in the apparatus, the N$_2$ gas needs not be supplied. Incidentally, flat-band shift was examined with respect to the various nitrogen dopant concentrations of the surface channel layer 5 by means of C-V measurement in dark. The result is shown in FIG. 9. As shown in the figure, when the nitrogen concentration in the surface channel layer 5 is equal to or less than 1×10$^{15}$ cm$^{-3}$, the flat-band shift is extremely decreased. This means that, when the surface channel layer 5 is formed to have the nitrogen concentration equal to or less than 1×10$^{15}$ cm$^{-3}$, the carrier traps caused by Si-N bonds can be significantly decreased.

In this case, the thickness of the surface channel layer 5 is fixed based on the following equation (1) so that the vertical power MOSFET becomes the normally OFF type. When the vertical power MOSFET is the normally OFF type, it is necessary to have a sufficient barrier height in a state where gate voltage is not applied so that a depletion layer extending in the n− type layer prevents electrical conduction. The equation (1) representing this condition is as follows.

$$Tepi = \sqrt{\frac{2\varepsilon s}{q} \cdot \frac{N_D + N_A}{N_D N_A} \cdot V_{built}} + \sqrt{\frac{2\varepsilon s}{q} \cdot \frac{1}{N} \cdot \left(\phi ms - \frac{Q_s + Q_{fc} + Q_i + Q_{ss}}{C_{oxide}}\right)} \quad (1)$$

where Tepi is the width of the depletion layer extending in the n− surface channel type layer, φms is a work function difference between metal and semiconductor, $Q_s$ is space charge in the gate oxide film, $Q_{fc}$ is fixed charge at the interface between the gate oxide film (SiO$_2$) and the n− type surface channel layer (SiC), $Q_i$ is a movable ion amount in the gate oxide film, $Q_{ss}$ is surface charge at the interface between the gate oxide film and the surface channel layer, and $N_D$, $N_A$ are donor and acceptor concentrations, respectively.

In the equation (1), the first term on the right side represents an extending width of the depletion layer produced by a built-in voltage $V_{built}$ of the PN junction between the surface channel layer 5 and the P⁻ type base regions 3a, 3b, i.e., an extending width of the depletion layer extending from the p type base regions 3a, 3b into the surface channel layer 5. The second term on the right side represents an extending width of the depletion layer produced by the charge in the gate oxide film 7 and φms, i.e., an extending width of the depletion layer extending from the gate oxide film 7 into the surface channel layer 5. Therefore, when the sum of the extending widths of the depletion layers extending from the p⁻ type base regions 3a, 3b and from the gate oxide film 7 is equal to or larger than the thickness of the surface channel layer 5, the vertical power MOSFET becomes the normally OFF type. In this embodiment, the thickness of the surface channel layer 5 is fixed to comply with these conditions.

That is, the thickness of the surface channel layer 5 for the normally OFF type MOSFET is smaller than Tepi. Here, as understood from the equation (1), when the impurity concentration in the surface channel layer 5 is low, $N_D$ is decreased so that Tepi is increased. Therefore, the thickness of the surface channel layer 5 can be increased, resulting in favorable controllability of the thickness when the surface channel layer 5 is epitaxially grown.

In the normally OFF type vertical power MOSFET, even when voltage cannot be applied to the gate electrode due to a device failure or the like, no current flows in the MOSFET, resulting in high reliability as compared to a normally ON type. Further, as shown in FIG. 4, the p⁻ type base regions 3a, 3b contact the source electrode 10 to be a grounded state. Therefore, the surface channel layer 5 can be brought to a pinch-off state by utilizing the built-in voltage $V_{built}$ of the PN junction between the surface channel layer 5 and the P⁻ type base regions 3a, 3b. As opposed to this, when the p⁻ type base regions 3a, 3b are set at a floating state without being grounded, because the depletion layer cannot be enlarged from the p⁻ type base regions 3a, 3b by the built-in voltage $V_{built}$, the surface channel layer 5 cannot be brought to the pinch-off state by the built-in voltage $V_{built}$.

In the first embodiment, the impurity concentration in the p⁻ type base regions 3a, 3b is relatively low; however, the built-in voltage $V_{built}$ can be increased by increasing the impurity concentration in the p⁻ type base regions 3a, 3b. In the first embodiment, because the vertical power MOSFET is formed from SiC, it can be manufactured with high accuracy. As opposed to this, when the vertical power MOSFET is formed from silicon (Si), it is difficult to control amounts of thermal diffusion occurring when the p⁻ type base regions 3a, 3b, the surface channel layer 5, and the like are formed. This makes it difficult to manufacture the normally OFF type MOSFET from Si to have substantially the same structure as described above.

In addition, when Si is used for the MOSFET, because the built-in voltage of silicon is low, it is necessary to thin the surface channel layer or to decrease the impurity concentration in the surface channel layer as compared with the case using SiC, making the manufacture of the MOSFET more difficult. To the contrary, when SiC is used, because the built-in voltage of SiC is approximately three times as large as that of Si, the thickness of the surface channel layer 5 can be increased and/or the impurity concentration in the surface channel layer 5 can be increased. Therefore the normally OFF accumulation type MOSFET can be easily manufactured in the embodiment.

Then, steps after forming the surface channel layer 5 will be explained.

Figure 6A:
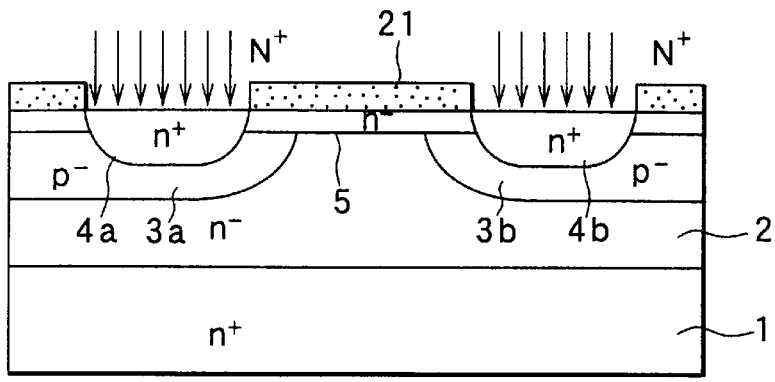

Step shown in FIG. 6A

An LTO film 21 is disposed on specific regions of the surface channel layer 5, and n type impurities such as N are implanted to form the n⁺ type source regions 4a, 4b using the LTO film 21 as a mask. As the ion implantation conditions, a temperature is 700° C., and a dose is $1 \times 10^{15}$ cm².

Figure 6B:
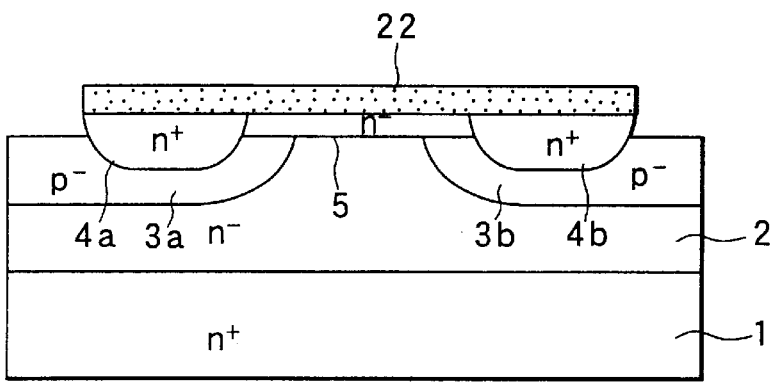

Step shown in FIG. 6B

After the LTO film 21 is removed, another LTO film 22 is disposed on a specific region of the surface channel layer 5 by a photo-resist method. Then, the surface channel layer 5 extending on the p⁻ type base regions 3a, 3b is partially removed by a reactive ion etching (RIE) method using the LTO film 22 as a mask.

Figure 6C:
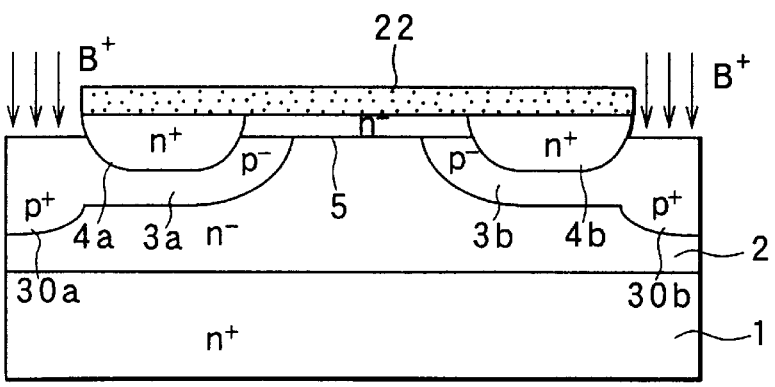

Step shown in FIG. 6C

Then, boron ions (B⁺) are implanted to form deep base layers 30a, 30b using the LTO film 22 as a mask again. Accordingly, the base regions 3a, 3b are partially thickened. The deep base layers 30a, 30b are formed not to overlap with the n⁺ source regions 4a, 4b. In addition, the thick thickness portions of the p⁻ type base regions 3a, 3b where the deep base layers 30a, 30b are formed have an impurity concentration larger than that of the thin thickness portions of the p⁻ type source regions 3a, 3b where the deep base layers 30a, 30b are not formed.

Figure 7A:
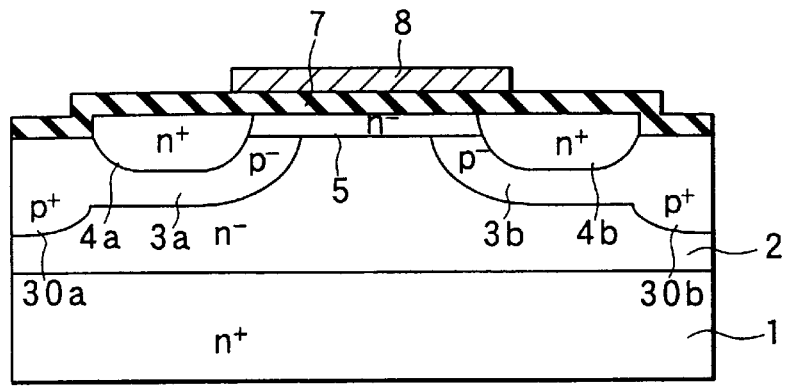

Step shown in FIG. 7A

After the LTO film 22 is removed, the gate oxide film 7 is formed on the substrate by wet-oxidation (including a pyrogenic method using $H_2$ and $O_2$) at 1080° C. At that time, because the nitrogen concentration in the surface channel layer 5 underlying the gate oxide film 7 is equal to or less than $1 \times 10^{15}$ cm⁻³ as described above, silicon nitride (SiN) is prevented from being produced during the thermal oxidation for forming the gate oxide film 7.

Therefore, the amount of silicon nitride in the gate oxide film 7 and at the interface between the gate oxide film 7 and the surface channel layer 5 is extremely decreased. Accordingly, the adverse effect by the carrier traps (interface states) caused by silicon nitride is reduced. The adverse effect to the electric characteristics such as a gate threshold voltage can be ignored, resulting in favorable FET characteristics and high reliability to the gate oxide film 7.

After that, the gate electrode 8 made of polysilicon is deposited on the gate oxide film 7 by an LPCVD method at 600° C.

Figure 7B:
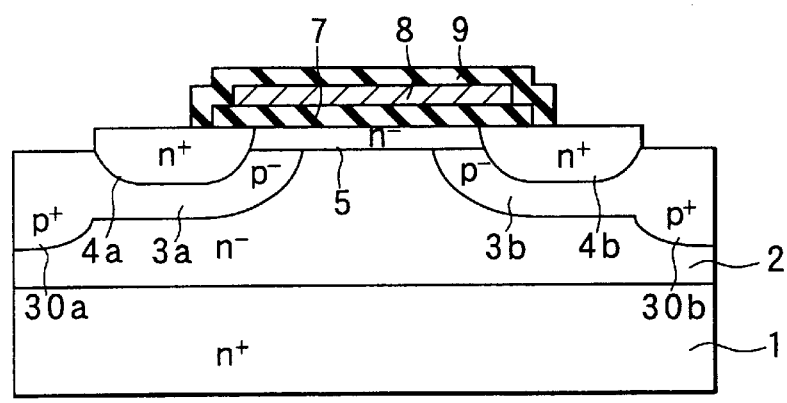

Step shown in FIG. 7B

After unnecessary portions of the gate oxide film 7 is removed, the insulation film 9 made of LTO is formed to cover the remaining gate oxide film 7. The deposition temperature is 425° C. After the deposition, an annealing treatment is carried out at 1000° C.

Figure 7C:
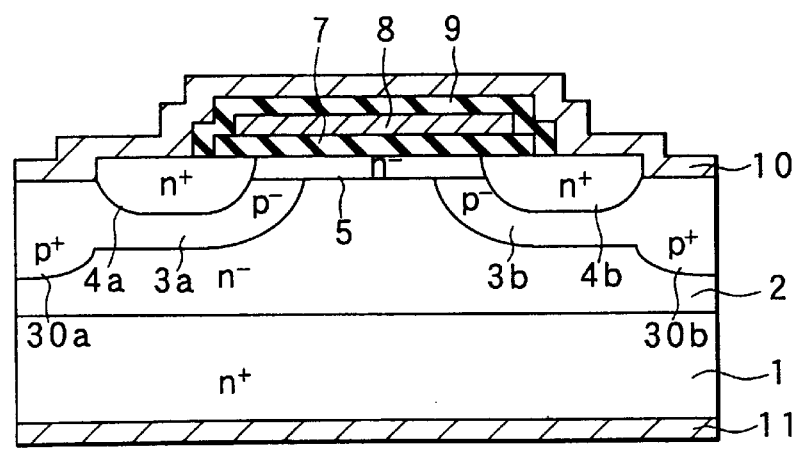

Step shown in FIG. 7C

Then, the source electrode 10 and the drain electrode 11 are deposited by metal-sputtering, respectively, at room temperature. After the deposition, an annealing treatment is carried out at 1000° C. Thus, the vertical power MOSFET shown in FIG. 4 is completed.

Next, operation of the vertical power MOSFET will be explained. The normally OFF type MOSFET operates at an accumulation mode. When the voltage is not applied to the gate electrode 8, the surface channel layer 5 is entirely depleted due to the electrostatic potential difference between the p⁻ type base regions 3a, 3b and the surface channel layer 5, and the potential produced by the work function difference between the surface channel layer 5 and the gate electrode 8. The potential difference produced by the work function difference between the surface channel layer 5 and the gate electrode 8 and by the sum of externally applied voltages can be changed by applying the voltage to the gate electrode 8. As a result, the channel state is controlled.

That is, when the work functions of the gate electrode 8, the p⁻ type base regions 3a, 3b and the surface channel layer 5 are represented by first, second, and third work functions, respectively, the first to third work functions, the impurity concentration and the thickness of the surface channel layer 5 are fixed so that the n type carriers in the surface channel layer 5 are completely depleted by the difference among the first to third work functions.

Also, in an OFF state, the depletion region is formed in the surface channel layer 5 due to the electric field produced between the p⁻ type base regions 3a, 3b and the gate electrode 8. In this state, when a positive bias is applied to the gate electrode 8, a channel region is formed at the interface between the gate oxide ($SiO_2$) film 7 and the surface channel layer 5 to extend from the n⁺ type source regions 4a, 4b toward the n⁻ type epi-layer (n⁻ type drift region) 2. Consequently, the state is switched to an ON state. At that time, electrons flow from the n⁺ type source regions 4a, 4b to the n⁻ type epi-layer 2 through the surface channel layer 5, and the electrons which have reached the n⁻ type epi-layer 2 then vertically flow to the n⁺ type semiconductor substrate 1 (n⁻ drain). Thus, the accumulation type channel is induced in the surface channel layer 5 by the positive voltage applied to the gate electrode 8, so that carriers flow between the source electrode 10 and the drain electrode 11.

Second Embodiment

In the first embodiment, nitrogen is doped into the surface channel layer 5 with a low nitrogen concentration, and accordingly the amount of silicon nitride existing in the gate oxide film 7 and at the interface between the gate oxide film 7 and the surface channel layer 5 is prominently decreased. As opposed to this, in a second preferred embodiment, another method, i.e., another manufacturing method, is employed to decrease the amount of silicon nitride existing in the above-mentioned portions. Manufacturing steps similar to those shown in FIGS. 5A–5C, 6A–6C, and 7A–7C will be explained referring to the same figures. A vertical power MOSFET in the second embodiment has a structure substantially the same as that shown in FIG. 4 except that the nitrogen concentration in the surface channel layer 5 can be set in a range of approximately $1\times10^{15}$ cm⁻³ to $1\times10^{17}$ cm⁻³, which is larger than that in the first embodiment. Herebelow, the manufacturing method in this embodiment will be explained.

First, the steps shown in FIGS. 5A–5C are carried out substantially the same way as in the first embodiment. Accordingly, the surface channel layer 5 is formed. Next, the step shown in FIG. 6A for forming the gate oxide film 7 is carried out as follows. First, after performing RCA washing, a heat treatment is carried out in hydrogen ambience at 1000° C. Wet oxidation is then carried out by a pyrogenic method or the like at 1100° C. for 5 hours. Further, the temperature is controlled to be 950° C., and the wet oxidation is carried out again by the pyrogenic method or the like for 3 hours as roxidation annealing. As a result, the gate oxide film 7 is formed.

Next, annealing (high temperature annealing) is carried out at 1250° C. in the hydrogen ambience. Silicon nitride in the gate oxide film 7 and at the interface between the gate oxide film 7 and the surface channel layer 5 is decomposed during the high temperature annealing. Accordingly, not only the interface state density but also the fixed charge at the interface between the gate oxide film 7 and the surface channel layer 5 is decreased, so that the same effects as in the first embodiment can be achieved. After that, the vertical power MOSFET in the second embodiment is completed through the steps shown in FIGS. 6B, 6C, and 7A–7C.

Third Embodiment

In a third embodiment, the amount of silicon nitride produced in the above-mentioned portions is effectively decreased by a manufacturing method different from those in the first and second embodiments. Manufacturing steps similar to those shown in FIGS. 5A–5C, 6A–6C, 7A–7C in the first embodiment will be explained referring to the same figures. A vertical power MOSFET in the third embodiment has a structure substantially the same as that shown in FIG. 4 except that the nitrogen concentration in the surface channel layer 5 can be set in a range of approximately $1\times10^{15}$ cm⁻³ to $1\times10^{17}$ cm⁻³, which is larger than that in the first embodiment. Herebelow, the manufacturing method in the third embodiment will be explained.

First, the steps shown in FIGS. 5A–5C are carried out substantially the same manner as in the first embodiment. Accordingly, the surface channel layer 5 is formed. Next, as shown in FIG. 6A, the gate oxide film 7 is formed on the surface channel layer 5, specifically by oxidation carried out in $H_2+O_2$ ambience at 1080° C. The gate oxide film 7 formed under these conditions has a thickness of approximately 50 nm.

After that, a heat treatment is carried out again in the $H_2+O_2$ ambience at a low temperature of 950° C. Herebelow, the low temperature annealing which is performed in the ambience including oxygen is referred to as a low temperature reoxidation heat treatment. The low temperature reoxidation heat treatment can reduce carbon clusters produced at the silicon dioxide and silicon carbide ($SiO_2$/SiC) interface so that hole traps caused by the carbon clusters are reduced.

Figure 10:
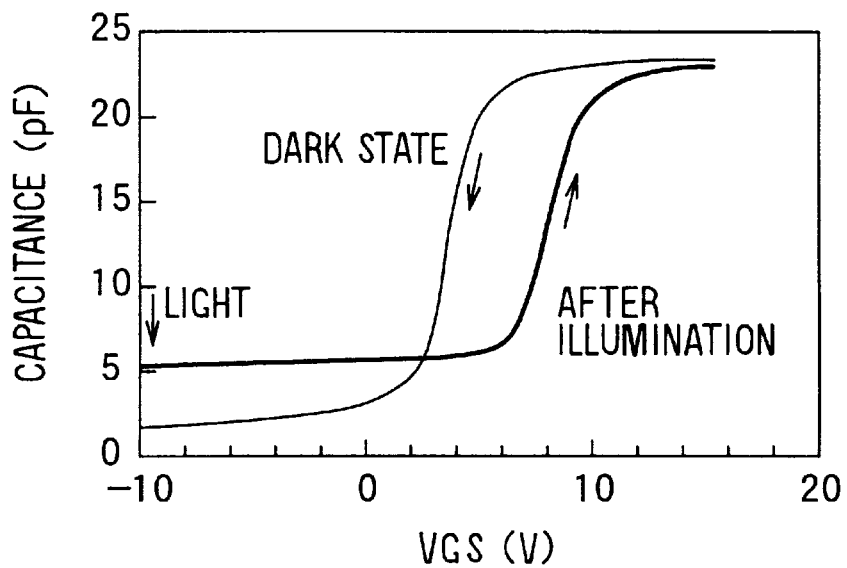
FIG. 10 is a chart for explaining existance of electron traps after a low temperature reoxidation treatment is carried out in a third preferred embodiment of the present invention.

However, the inventors performed the C-V measurement after the low temperature reoxidation heat treatment was carried out, and found that the electron traps existed in the gate oxide film 7 and at the interface between the gate oxide film 7 and the surface channel layer 5, thereby increasing the interface state density. For example, as shown in FIG. 10, the flat-band shift after the low temperature reoxidation heat treatment was large. This result means that negative fixed charges or deep level electron traps exist. Further, the light illumination C-V characteristic has the hysteresis characteristic and indicates the existence of an electron trap level capable of trapping electrons by light excitation. The electron traps are considered to be caused by silicon nitride (Si-N bonds).

Figure 11:
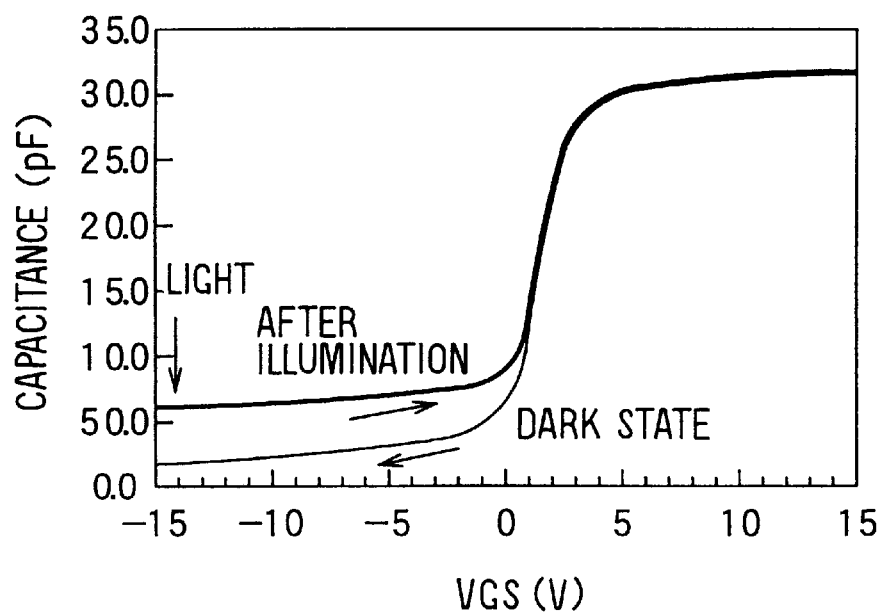
FIG. 11 is a chart showing a light illumination C-V measurement result after annealing is carried out after the low temperature reoxidation treatment in the third embodiment.

Therefore, in this embodiment, another heat treatment is successively carried out in the ambience including oxygen, at a temperature lower than 1000° C., for example, at approximately 950° C. equal to the temperature of the low temperature reoxidation heat treatment. Then, the electric characteristic inside the gate oxide film 7 or at the interface between the gate oxide film 7 and the surface channel layer 5 after this annealing was examined by the C-V measurement. The result is shown in FIG. 11. As shown in the figure, the flat-band shift is decreased to less than 2V, and the hysteresis characteristic is not observed. It is considered that the reason of the result is because Si and N forming the Si-N bonds react with oxygen, which is active even at a low temperature, to produce $NO_x$ and $SiO_x$, so that the electron traps are reduced.

Here, the ambience and temperature conditions of the annealing which is carried out after the low temperature reoxidation heat treatment will be explained in more detail. The ambience and temperature were optimized to reduce the electron traps. Specifically, after annealing was carried out in $O_2$ ambience at a constant temperature for 1 hour, an interface state density change and a thickness change of the oxide film were examined.

Figure 12:
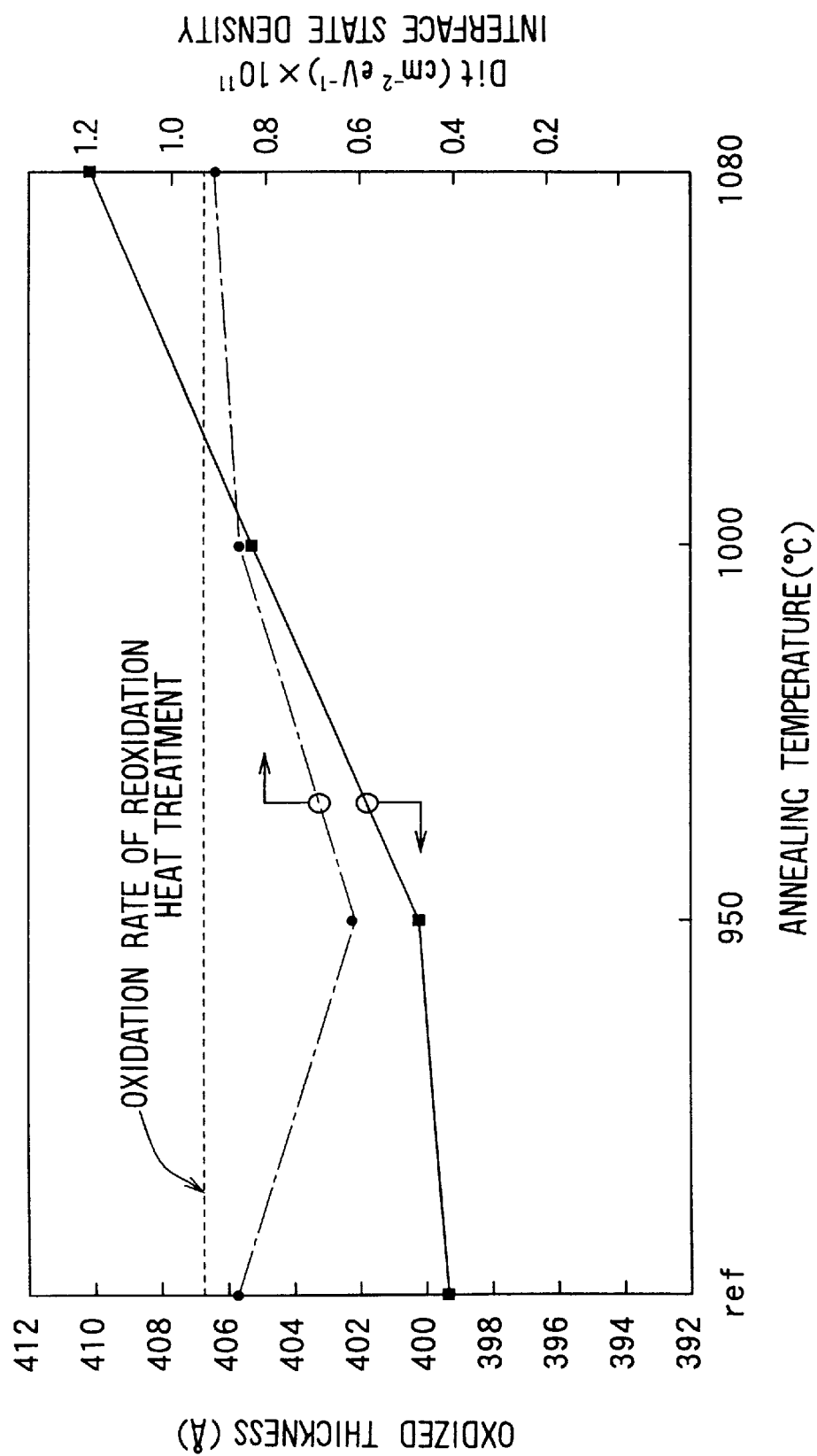
FIG. 12 is a graph showing relationships between oxidized thicknesses and annealing temperatures and between interface state densities and annealing temperatures, respectively, in a case where the annealing is carried out in an oxygen ambience.

As a result, as shown in FIG. 12, in the case where the annealing temperature is approximately 950° C., the interface state density becomes the minimum, and the oxidized thickness is small as compared to those at the other annealing temperatures. The points indicated with ref on the left side in FIG. 12 are a thickness and an interface state density which were obtained as references after performing the low temperature reoxidation heat treatment. When the annealing is further performed under the same conditions as those of the low temperature reoxidation heat treatment except a time period, i.e., in $H_2+O_2$ ambience at 950° C. for 1 hour, the thickness is increased up to the point indicated by a broken line in FIG. 12.

Accordingly, it is considered that the oxidized thickness, i.e., the oxidation rate for forming the oxide film is closely related to the interface state density. That is, it is considered that the larger the oxidation rate becomes, the larger the interface state density becomes, and vice versa. Accordingly, the following phenomenon is assumed. When the oxidation rate becomes small, oxygen, which is activate even at a low temperature, is combined with Si and N forming the Si-N bonds. Accordingly, the formation of the oxide film progresses while decomposing the Si-N bonds. Therefore, the electron traps are hardly produced. When the oxidation rate becomes large, however, because the formation of the oxide film progresses in the sate where Si-N bonds remain, the electron traps are easily produced by the remaining Si-N bonds.

For example, as a result of studies performed on the oxide film which was obtained after performing the low temperature reoxidation heat treatment, as described above, it was confirmed that the electron traps caused by the Si-N bonds arose in the oxide film. This means that the electron traps are produced at the oxidation rate in the low temperature reoxidation heat treatment. The oxidation rate of the oxide film formed by the low temperature reoxidation heat treatment is 0.8 nm/h, which corresponds to the thickness indicated by the dotted line in FIG. 12. Accordingly, it is confirmed that the electron traps become liable to be produced when the oxidation rate becomes large.

Thus, in this embodiment, it is found that the annealing which is carried out after the low temperature reoxidation heat treatment decreases the interface state density in the gate oxide film 7 and at the interface between the gate oxide film 7 and the surface channel layer 5. This annealing is herebelow referred to as an electron trap reducing annealing. As understood from FIG. 12, the electron trap reducing annealing is carried out at a low temperature as compared to that in the second embodiment. Further, because the electron trap reducing annealing is carried out at a temperature approximately equal to that (around 950° C.) of the low temperature reoxidation heat treatment, the electron trap reducing annealing can be carried out only by exchanging the ambient gas immediately after the low temperature reoxidation heat treatment is carried out, resulting in a simplified manufacturing process. Because the temperature of the electron trap reducing annealing needs not be raised, the interface state density characteristic is not varied due to the ambient gas during the temperature raising period.

Figure 13:
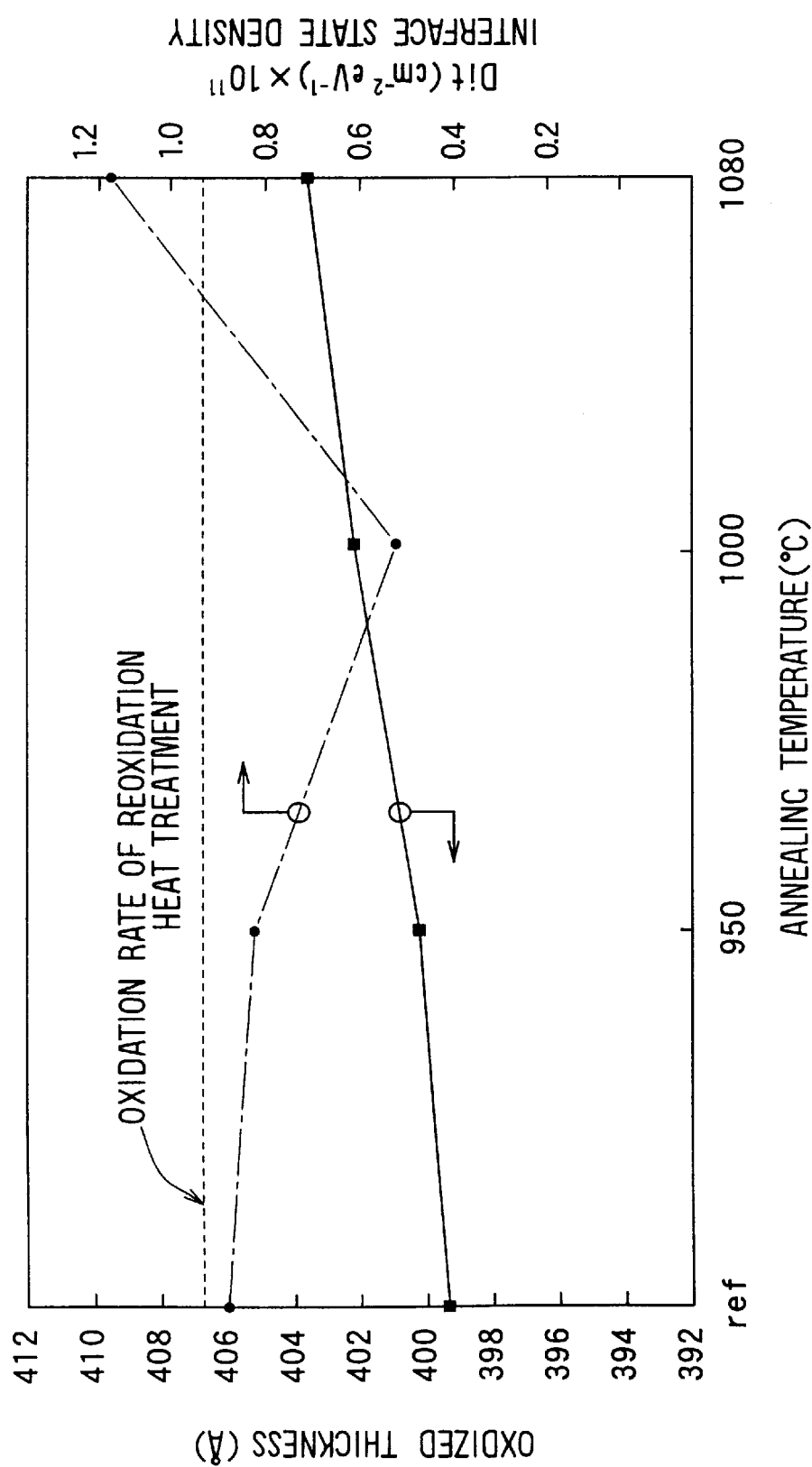
FIG. 13 is a graph showing relationships between oxidized thicknesses and annealing temperatures and between interface state densities and annealing temperatures, respectively, in a case where the annealing is carried out in ambience including oxygen and nitrogen with a content of 1:100.

Although the electron trap reducing annealing is carried out in the ambience including oxygen, the content of oxygen may be decreased. For example, FIG. 13 shows a relationship between an oxidized thickness and an interface state density of the oxide film when the annealing is carried out in ambience including nitrogen and oxygen with a ratio of nitrogen:oxygen being 100:1. As shown in the figure, even when the content of oxygen is small, the interface state density can be lowered. However, because the optimum annealing temperature for decreasing the interface state density may change according to the content of oxygen, it is preferable that the annealing temperature is optimized according to the content of oxygen. The ambience of the annealing can include, in addition to nitrogen, hydrogen, inert gas such as argon (Ar), or the like, and its mixture gas.

In the first to third embodiments, the surface channel layer 5 is epitaxially grown; however, the surface channel layer 5 may be formed by implanting ions into the p⁻ type base regions 3a, 3b. Also, in the first to third embodiments, although the present invention is applied to the planar-type MOSFET, it may be applied to a groove gate type MOSFET, a lateral MOSFET, and the like.

Figure 14:
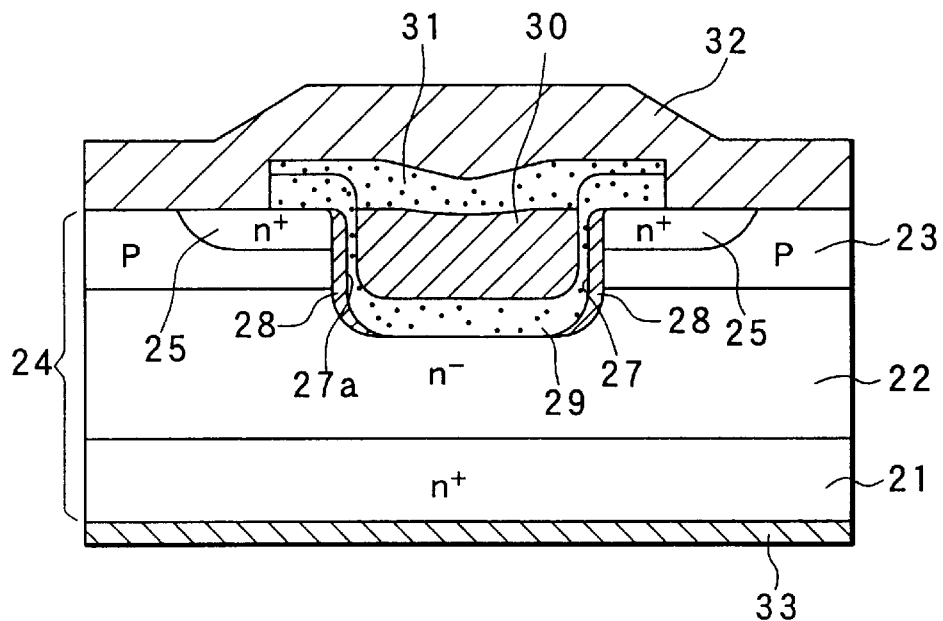
FIG. 14 is a cross-sectional view showing a groove gate type MOSFET in a modified embodiment of the present invention.

FIG. 14 shows a groove gate type MOSFET as an example. The groove gate type MOSFET includes a substrate 24 composed of an n⁺ type semiconductor substrate 21, an n⁻ type epi-layer 22, and a p type base layer 23. A groove 27 is formed from the surface of the substrate 24 to pass through a source region 25 disposed in a surface part of the p type base layer 23 and the p type base layer 23. A surface channel layer 28 is formed on a side wall 27a of the groove 27. A gate electrode 30 is formed in the groove 27 through a gate oxide film 29. A source electrode 32 is disposed on the gate electrode 30 through an intermediate insulation layer 31 and is connected to the source region 25 and the p type base layer 23. Further, a drain electrode 33 is provided on the back surface of the substrate 24.

In the groove gate type MOSFET with the constitution described above, for example, when the surface channel layer 28 underlying the gate oxide film 29 in the groove 27 is formed with a low impurity concentration as in the first embodiment, or when a high temperature annealing treatment is carried out after the gate oxide film 29 is formed as in the second embodiment, the same effects in the first and second embodiments can be obtained.

Figure 15:
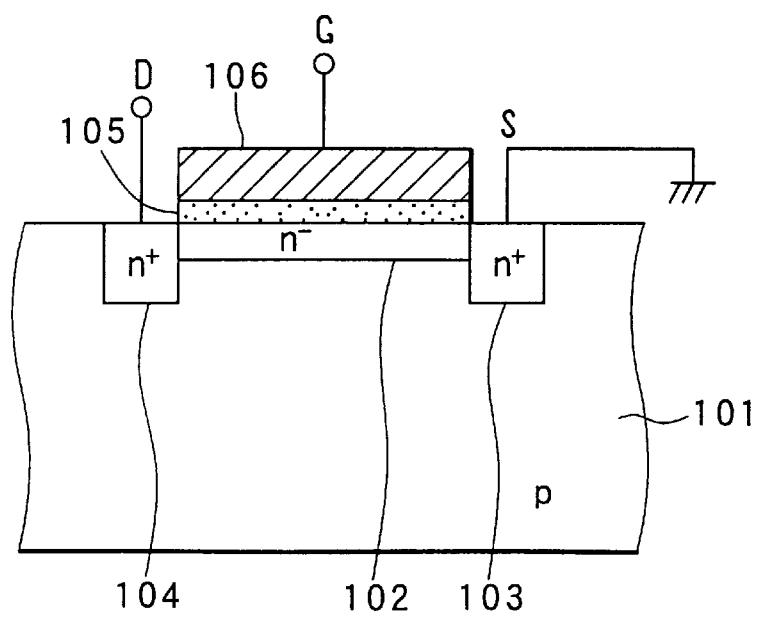
FIG. 15 is a cross-sectional view showing a lateral MOSFET in another modified embodiment of the present invention.

Also, FIG. 15 shows a lateral MOSFET. The lateral MOSFET includes a p type semiconductor substrate 101, and a surface channel layer 102 is formed in a specific surface region of the substrate 101 by ion-implantation or the like. Source and drain layers 103, 104 are formed at both sides of the surface channel layer 102. A gate electrode 106 is disposed on the surface channel layer 12 via a gate oxide film 105. In this lateral MOSFET, for example, when the surface channel layer 102 underlying the gate oxide film 105 is formed with a low impurity concentration as in the first embodiment, or when a high temperature annealing treatment is carried out after the gate oxide film 105 is formed as in the second embodiment, the same effects as in the first and second embodiments can be obtained.

In the second embodiment, although the high temperature heat treatment for decomposing silicon nitride is carried out in hydrogen ambience, it may be carried out in ambience including oxygen, inert gas such as Ar, its mixture gas, or the like to provide the same effects. Further, in the first to third embodiments, the present invention is applied to a silicon carbide semiconductor device including an accumulation type channel such as the surface channel layer 5; however, it can be applied to other types of silicon carbide semiconductor devices such as a device including an inversion type channel region which is formed, for example, by inverting an n type semiconductor layer into a p type semiconductor layer.

Fourth Embodiment

In a vertical power MOSFET according to a fourth preferred embodiment, the surface channel layer 5 is formed by doping thereinto an element selected from the fifteenth group (the obsolete 5B group) elements in the periodic table except nitrogen, such as phosphorus (P), arsenic (As), antimony (Sb), and bismuth (Bi).

The structure of the vertical power MOSFET in this embodiment is substantially the same as that shown in FIG. 4 and explained in the first embodiment. Therefore, the same parts are indicated by the same reference numerals, and the same explanation will not be reiterated. Incidentally, the vertical power MOSFET in this embodiment also has the deep base layers 30a, 30b (see FIG. 7C) where the base regions 3a, 3b are partially thickened. Accordingly, the n⁻ epi-layer 2 underlying the deep base layers 30a, 30b are thinned so that the interval between the n⁺ semiconductor substrate 1 and the deep base layers 30a, 30b is shortened, resulting in an increased field intensity. The increased field intensity can easily cause avalanche breakdown.

Next, a step for forming the surface channel layer 5 will be explained. The other steps for manufacturing the vertical power MOSFET in the fourth embodiment are substantially the same as those in the first embodiment.

Referring to FIG. 5C, after the p⁻ type base regions 3a, 3b are formed in the n⁻ epi-layer 2, the surface channel layer 5 is formed on the n⁻ epi-layer 2 by the CVD method. At that time, epitaxial growth progresses using at least one of the fifteenth group elements except nitrogen (N), i.e., at least one of P, As, Sb, and Bi, as dopant. Accordingly, the surface channel layer 5 is formed without including nitrogen. In this case, preferably, the impurity concentration in the surface channel layer 5 is controlled to be in a range of $1\times10^{15}$ cm⁻³ to $1\times10^{17}$ cm⁻³ and the concentration of the unintendedly doped nitrogen should be equal to or less than $1\times10^{15}$ cm⁻³ as in the first embodiment.

Also, in this case, as explained in the first embodiment, the thickness of the surface channel layer 5 is fixed to be smaller than the sum of the extending widths of the depletion layer extending from the p⁻ type base regions 3a, 3b into the surface channel layer 5 and the depletion layer extending from the gate oxide film 7 into the surface channel layer 5, when no voltage is applied to the gate electrode 8. Accordingly, the vertical power MOSFET becomes the normally OFF type. The effects, applicable changes and the like of the thus obtained normally OFF type vertical power MOSFET are the same as those in the first embodiment.

In addition to that, in the fourth embodiment, because the surface channel layer 5 underlying the gate oxide film 7 does not include nitrogen, even after the gate oxide film 7 is formed by thermal oxidation, silicon nitride is hardly produced therein. Only nitrogen remaining in an oxidation apparatus used for the wet oxidation, nitrogen diffused into the silicon carbide, and the like can produce silicon nitride; however, it is possible to reduce those elements to be negligible. Even when the remaining nitrogen, which has a segregation coefficient with respect to silicon carbide larger than those of the other dopants, is doped into the surface channel layer 5 doped with the dopant other than nitrogen, the concentration of nitrogen is clearly lower than the concentration of the dopant other than nitrogen. Therefore, the problem described above can not be caused by the nitrogen.

Consequently, nitrogen hardly exists not only in the gate oxide film 7 but also at the interface between the gate oxide film 7 and the surface channel layer 5. The adverse effects by carrier traps (interface states) caused by silicon nitride are lowered, so that the FET characteristics and the reliability of the gate oxide film 7 are improved.

In addition, although the controls of the thickness and the dopant concentration of the surface channel layer 5 are important for the MOSFET which is operated at an accumulation mode, the dopant concentration control is very difficult when nitrogen is used as the dopant of the surface channel layer 5. This is because the segregation coefficient of nitrogen in silicon carbide is larger than 1. As opposed to this, because almost all the fifteenth group elements other than nitrogen have segregation coefficients smaller than 1, the dopant concentration control can be easily performed in this embodiment.

Also, the impurity level formed when the element other than nitrogen is used as the dopant is deeper than that formed when nitrogen is used as the dopant, so that the Fermi level is effectively deepened. This is advantageous to obtain the normally OFF characteristics utilizing the PN junction between the surface channel layer 5 and the p⁻ type base regions 3a, 3b. Incidentally, it is preferable that nitrogen that is capable of producing a shallow impurity level is used as the dopant for the n⁺ type semiconductor substrate and for the n⁺ source regions 4a, 4b to increase electron densities.

The operation of the vertical power MOSFET in this embodiment is substantially the same as that in the first embodiment, and therefore, the explanation will be omitted.

In the fourth embodiment, the surface channel layer 5 underlying the gate oxide film 7 is formed by using the dopant selected from the fifteenth group elements other than nitrogen. This is because the surface region of the surface channel layer 5 is thermally oxidized to form the gate oxide film 7. Therefore, it is not necessary to form the n type semiconductor regions other than the surface channel layer 5 with the dopant other than nitrogen.

Although the surface channel layer 5 is formed through epitaxial growth, it may be formed by ion-implanting the fifteenth group element other than nitrogen into the p⁻ type base regions 3a, 3b. Also, it is apparent that the fourth embodiment can be applied to other types of MOSFETS such as a so-called groove gate type MOSFET shown in FIG. 14 and a so-called lateral MOSFET shown in FIG. 15, in addition to the planar-type MOSFET shown in FIG. 4. That is, in the groove gate type MOSFET shown in FIG. 14, the surface channel layer 28 disposed under the gate oxide film 29 may be formed by doping therein the dopant selected from the fifteenth group elements other than nitrogen. In the lateral MOSFET shown in FIG. 15, the surface channel layer 102 disposed under the gate oxide film 105 may be formed by doping therein the fifteenth group elements other than nitrogen.

Also, the gate oxide film 7 can be formed by thermally oxidizing an oxide film, which is deposited on the surface channel layer 5 by the CVD method or the like. Accordingly, a thermally oxidized film is provided at the interface between the deposited oxide film and silicon carbide (the surface channel layer) as the gate oxide film.

Fifth Embodiment

In the groove gate type MOSFET shown in FIG. 14, when voltage is applied to the gate electrode 30, an accumulation type channel can be induced in the n type surface channel layer (thin film semiconductor layer) 28 and current flows between the source electrode 32 and the drain electrode 33 through the channel. In this type of MOSFET, because the impurity concentration in the p type epitaxial layer (thin film semiconductor layer) 23 and the impurity concentration of the n type thin film semiconductor layer 28 can be independently controlled, the p type epitaxial layer 23 intervening between the n+ type source region 25 and the n− type epitaxial layer 22 can be formed with a high impurity concentration to have a thin thickness. Accordingly, the channel length is shortened, resulting in high blocking voltage and low ON-resistance. Further, because the operation mode of the MOSFET is an accumulation mode in which the channel is induced without inverting the conductive type of the channel formation layer, the MOSFET can be operated by gate voltage lower than that of an inversion mode type MOSFET in which the channel is induced by inverting the conductive type.

However, in the semiconductor device using silicon carbide, interface sates formed at an interface between a silicon dioxide region (the gate oxide film 29) and a silicon carbide region (the n− type epitaxial layer 22, the p type epitaxial layer 23, and the n+ type source regions 25) have a density (interface state density) which is larger than that formed at a silicon and silicon dioxide interface by a factor of from $10^1$ to $10^2$. The large interface state density is caused by carbide, dopant such as aluminum, nitrogen, or boron existing in the silicon carbide region, and/or defects which do not exist in the silicon and silicon dioxide (Si/SiO$_2$) interface and are peculiar to the silicon carbide and silicon dioxide (SiC/SiO$_2$) interface. When the interface state density is large, the channel mobility is decreased and the ON-resistance is increased. The increased ON-resistance causes an increased continuity loss, exothermic of the transistor, a decreased switching speed, and the like.

In view of all the above, in a fifth preferred embodiment, the interface state density is appropriately controlled not to increase the transistor ON-resistance based on computer simulation results described below.

That is, as described above, the transistor ON-resistance relies upon the interface state density at the interface between the silicon dioxide region and the silicon carbide region. Therefore, the relationship between the interface state density and the ON-resistance in a simulation model shown in FIG. 16 was calculated by means of a device simulator, MEDICI (produced by Technology Modeling Association inc.). The simulation results are shown in FIG. 17. In the figure, numeric values denoted with parentheses represent a thickness and an impurity concentration of a side wall epi-channel layer, respectively.

Figure 16:
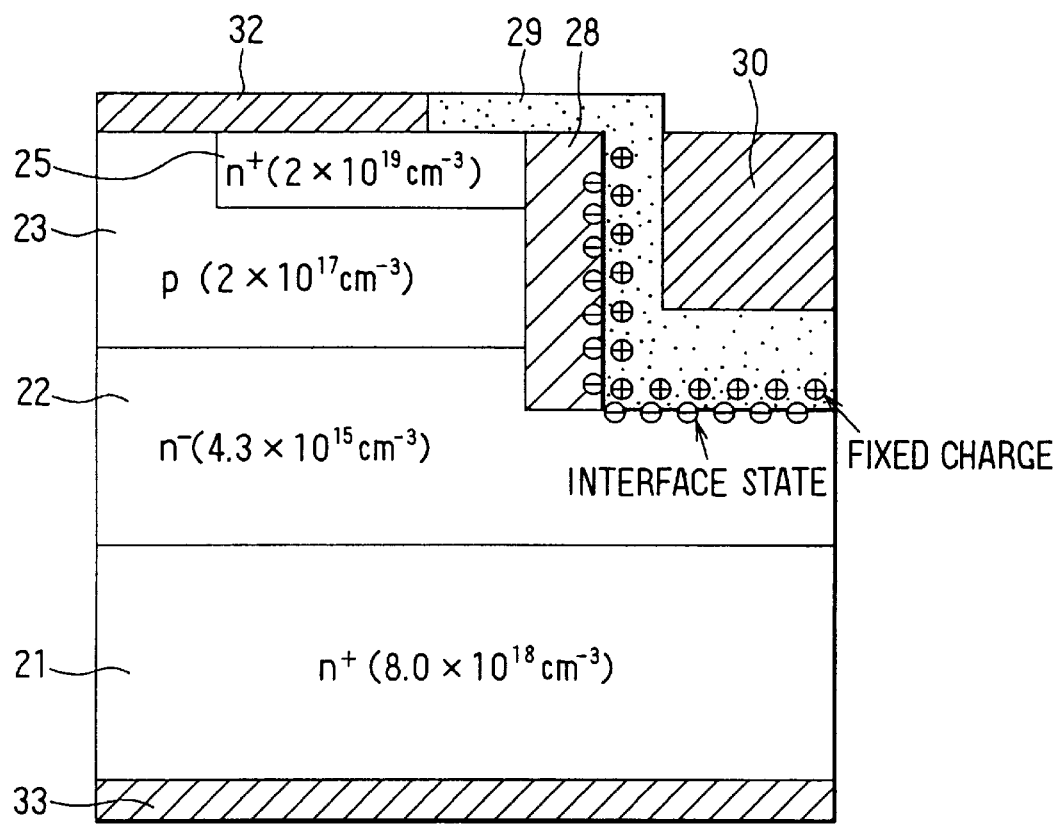
FIG. 16 is a schematic view showing a simulation model for considering a relationship between an interface state density and an ON resistance.

In the simulation model, referring to FIG. 16, the impurity concentration in the semiconductor substrate 21 was set to $8 \times 10^{18}$ cm$^{-3}$, and the impurity concentration and thickness of the n− type epitaxial layer 22 were set to $4.3 \times 10^{15}$ cm$^{-3}$, 5.3 μm, respectively. The impurity concentration and thickness of the p type epitaxial layer 23 were set to $2 \times 10^{17}$ cm$^{-3}$, 1.9 μm, and the impurity concentration and thickness of the n+ type source region 25 were set to $2 \times 10^{19}$ cm$^{-3}$, 0.7 μm, respectively. The impurity concentration and thickness of the surface channel layer 28 were set to in a range of $10^{15}$ cm$^{-3}$ to $10^{16}$ cm$^{-3}$ and in a range of 0.2 μm to 0.3 μm, respectively. Voltage $V_{GS}$ across the gate and source electrodes was set to 15 V, and voltage $V_{DS}$ across the drain and source electrodes was set to 0.1 V.

As shown in FIG. 17, when the interface state density exceeds approximately $4 \times 10^{11}$ cm$^{-2}$ eV$^{-1}$, the ON-resistance prominently increases. Therefore, when the interface state density exceeds approximately $4 \times 10^{11}$ cm$^{-2}$ eV$^{-1}$, stable FET characteristics cannot be exhibited.

Figure 18A:
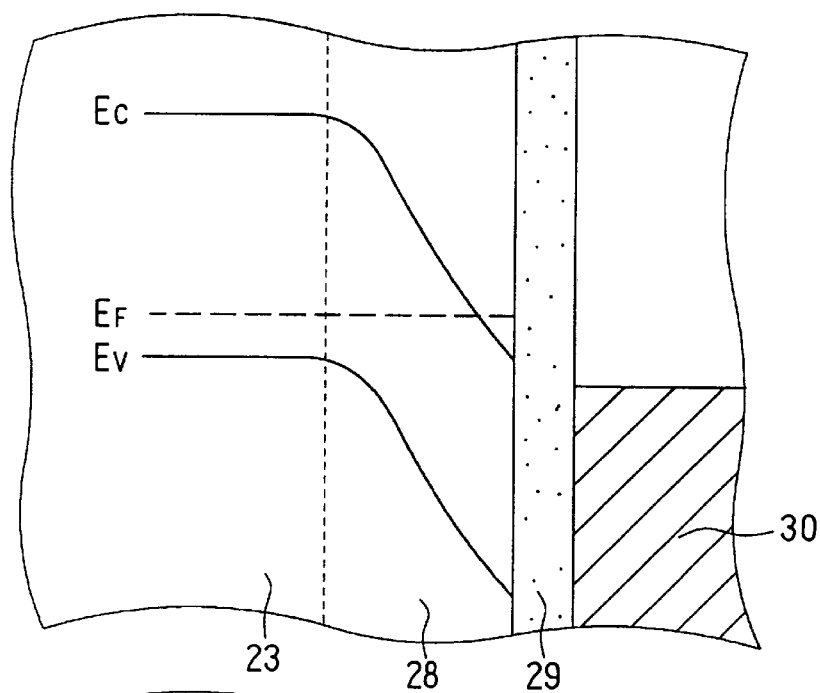
FIGS. 18A and 18B are bandgap diagrams for explaining the ON resistance.

The reason will be explained based on bandgap diagrams shown in FIGS. 18A and 18B, indicating relationships between the interface state density and a drain current flow in a state where gate voltage is applied. FIG. 18A indicates a case where the interface state density is small, e.g., equal to or less than approximately $4 \times 10^{11}$ cm$^{-2}$ eV$^{-1}$. When the interface state density is small, energy $E_C$ at an end of a conduction band is smaller than Fermi-level $E_F$ at the silicon dioxide and silicon carbide interface.

Figure 18B:
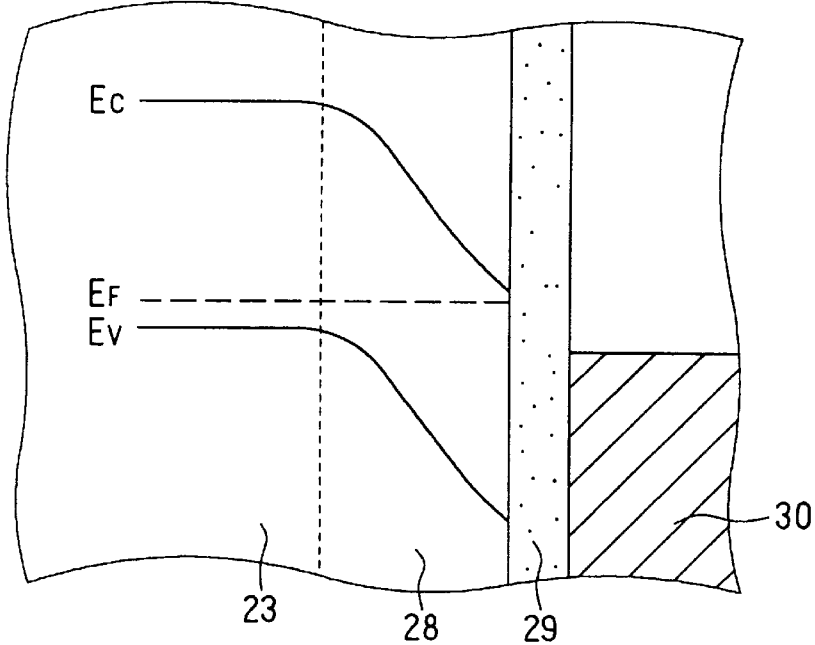

On the other hand, when the interface state density is large as shown in FIG. 18B, e.g, when the interface state density exceed approximately $4 \times 10^{11}$ cm$^{-2}$ eV$^{-1}$, energy $E_C$ at the end of the conduction band becomes larger than Fermi-level $E_F$ at the silicon dioxide and silicon carbide interface. Therefore, when the interface state density is equal to or less than approximately $4 \times 10^{11}$ cm$^{-2}$ eV$^{-1}$, the interface has relatively small ON-resistance so that drain current is liable to be flow therein; however, when the interface state density exceeds approximately $4 \times 10^{11}$ cm$^{-2}$ eV$^{-1}$, the interface has prominently increased ON-resistance, so that it becomes difficult for the drain current to flow therein. Further, carrier scattering is enhanced by the large interface state density so that the mobility is lowered. As a result, the ON-resistance is additionally increased due to the lowered mobility.

Therefore, the groove gate type MOSFET in the fifth embodiment is provided by adjusting the interface state density at the silicon dioxide and silicon carbide interface based on the relationship described above. As a result, the MOSFET can exhibit stable characteristics without increasing the ON-resistance and without relying on the interface state density.

Figure 19:
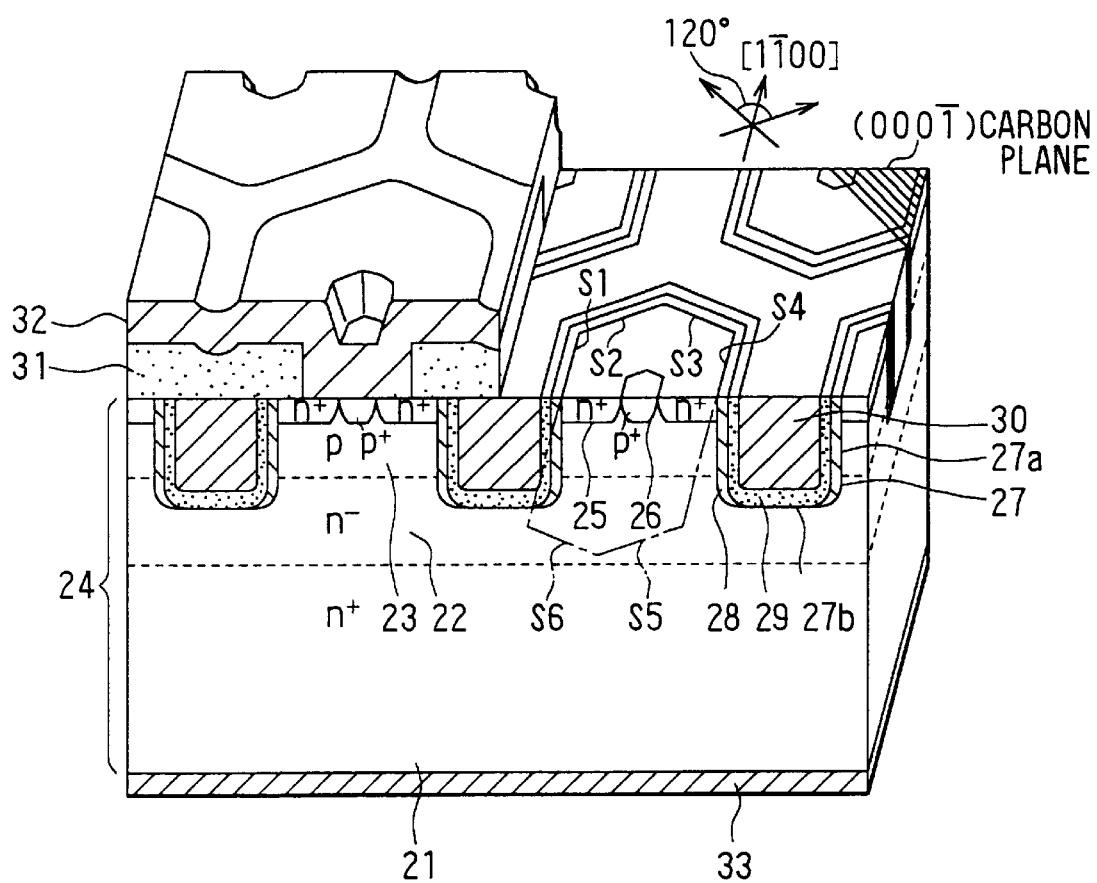
FIG. 19 is a perspective view showing a groove gate type power MOSFET in a fifth preferred embodiment of the present invention.

Herebelow, the structure and features of the groove gate type n-channel power MOSFET (vertical power MOSFET) in the fifth embodiment will be specifically explained referring to FIG. 19. In FIG. 19, the same parts as those in FIG. 14 are indicated by the same reference numerals.

An n+ type silicon carbide semiconductor substrate 21 as a low resistance semiconductor layer is made of hexagonal silicon carbide. An n− type silicon carbide semiconductor layer (n− type epitaxial layer) 22 as a high resistance semiconductor layer and a p type silicon carbide semiconductor layer (p type epitaxial layer) 23 as a first semiconductor layer are disposed on the n+ type silicon carbide semiconductor substrate 21 in that order. The n+ type silicon carbide semiconductor substrate 21, the n− type epitaxial layer 22, and the p type epitaxial layer 23 constitute a semiconductor substrate 24 made of single crystal silicon carbide and having an upper surface approximately corresponding to a (000$\bar{1}$) carbon plane.

Further, an n+ type source region 25 is formed in a specific surface region of the p type epitaxial layer 23, and a low resistance p type silicon carbide region 26 is formed in a specific surface region of the p type epitaxial layer 23 on an inner circumference side of the n+ type source region 25. A groove 27 is formed at a specific region of the n+ type source region 25 to pass through the n+ type source region 25 and the p type epitaxial layer 23 and to reach the n− type epitaxial layer 22. The groove 27 has a side wall 27a perpendicular to the surface of the semiconductor substrate 24 and a bottom wall 27b parallel to the surface of the semiconductor substrate 24.

Figure 20:
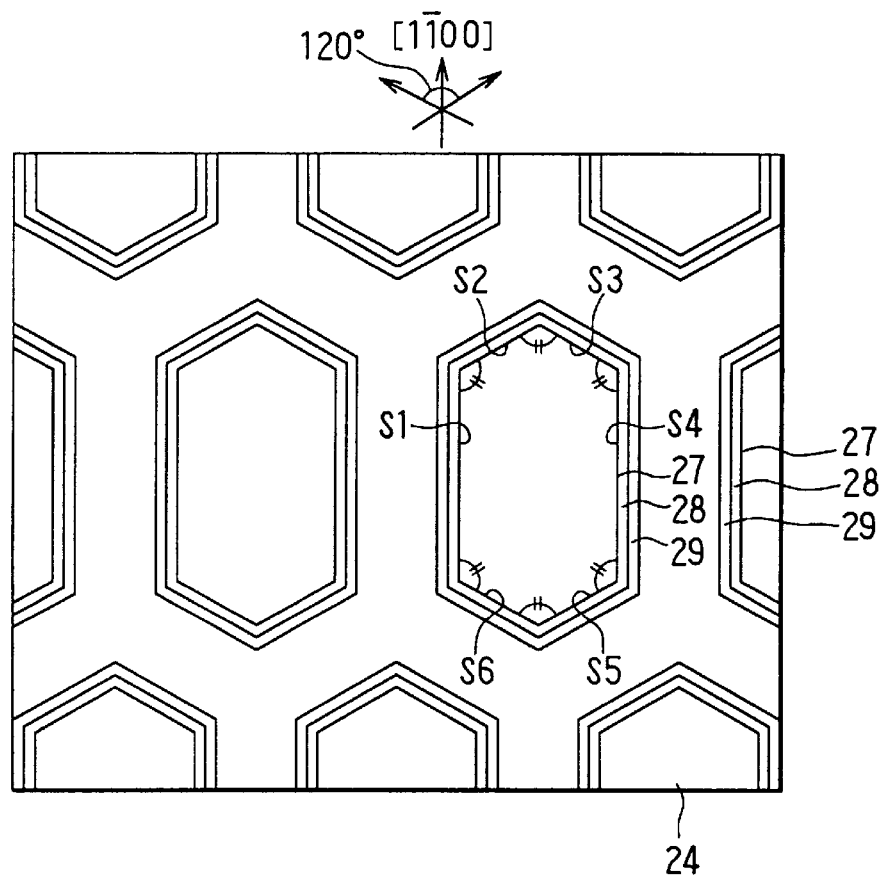
FIG. 20 is a plan view showing the MOSFET of FIG. 19.

The side wall 27a of the groove 27 is composed of several faces each extending approximately in parallel with a [1$\bar{1}$00] direction of silicon carbide. Here, the [1$\bar{1}$00] direction expresses all crystallographically equivalent directions, i.e., six directions of <1$\bar{1}$00>,<10$\bar{1}$0>,<01$\bar{1}$0>,<$\bar{1}$100>,<$\bar{1}$010>, and <0110>. The plane shape defined by the side wall 27a is a hexagon having interior angles generally equal to one another. That is, as shown in FIG. 20, the hexagon defined by the side wall 27a has six sides S1, S2, S3, S4, S5, and S6 and six interior angles of approximately 120 degrees defined between S1 and S2, S2 and S3, S3 and S4, S4 and S5, S5 and S6, and S5 and S1, respectively.

Referring again to FIG. 19, in the groove 27, a thin film semiconductor layer (second semiconductor layer) 28 made of n type semiconductor is disposed on the side wall 27a on which the n+ type source region 25, the p type epitaxial layer 23, and the n− type epitaxial layer 22 are exposed. The thin film semiconductor layer 28 has a thickness approximately in a range of 1000 Å to 5000 Å, and the same crystal structure type as that of the p type epitaxial layer 23, for example of 6H-SiC. The impurity concentration in the thin film semiconductor layer 28 is lower than those in the n+ type silicon carbide semiconductor substrate 21 and in the n+ type source region 25.

Incidentally, as described above, the crystal structure type of the semiconductor substrate 24 is 6H-SiC in a hexagonal system and the plane shape defined by the side wall 27a is a hexagon. Accordingly, the groove 27 can have a shape corresponding to the crystal structure type, resulting in a favorable surface state of the side wall 27a. The semiconductor substrate 24 may be made of 4H-SiC or 3C-SiC. In this case, likewise it is preferable that the groove 27 has a plane shape corresponding to the crystal structure type.

Further, a gate oxide film 29 made of silicon dioxide is disposed on the thin film semiconductor layer 28 and on the bottom wall 27b within the groove 27. The interface state density at the interface between the gate oxide film 29 and the thin film semiconductor layer 28 and between the gate oxide film 29 and the n− type epitaxial layer 22 is set to be equal to or lower than $4\times10^{11}$ cm$^{-2}$ eV$^{-1}$. Accordingly, FET characteristics become stable without relying on the interface state density.

A gate electrode 30 is disposed on the gate oxide film 29 in the groove 27, and is covered with an intermediate insulation film 31. A source electrode 32 is formed as a first electrode on the n+ type source region 25 and the low resistance p type silicon carbide region 26. A drain electrode 33 is formed as a second electrode on the surface of the n+ type silicon carbide semiconductor substrate 21, i.e., on the back face of the semiconductor substrate 24. In the thus constituted groove gate type power MOSFET, an accumulation type channel is induced by applying positive voltage to the gate electrode 30, so that carriers flow between the source electrode 32 and the drain electrode 33. In this case, the thin film semiconductor layer 28 serves as a channel formation region.

Next, a manufacturing process of the groove gate type power MOSFET will be explained referring to FIGS. 21 to 32.

Figure 21:
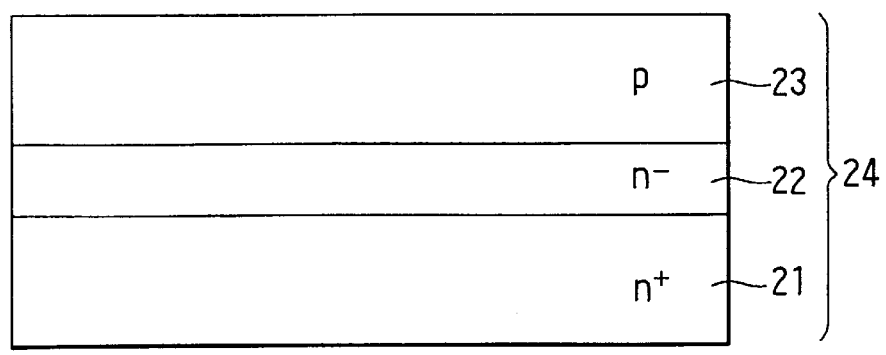
FIGS. 21 to 27 are cross-sectional views showing a process of manufacturing the MOSFET shown in FIG. 19.

Step shown in FIG. 21

First, the n+ type silicon carbide semiconductor substrate 21 having a main surface corresponding to a (0001) carbon plane is prepared, and the n− type epitaxial layer 22 is grown on the main surface. Further, the p type epitaxial layer 23 is grown on the n− type epitaxial layer 22. In this way, the semiconductor substrate 24 composed of the n+ type silicon carbide semiconductor substrate 21, the n− type epitaxial layer 22, and the p type epitaxial layer 23 is formed. In this case, the n− type epitaxial layer 22 and the p type epitaxial layer 23 are formed in a state where a crystal axis of the n+ type silicon carbide semiconductor substrate 21 is inclined by 3.5° to 8°. Therefore, the semiconductor substrate 24 has a main surface approximately corresponding to a (0001) carbon plane.

Figure 22:
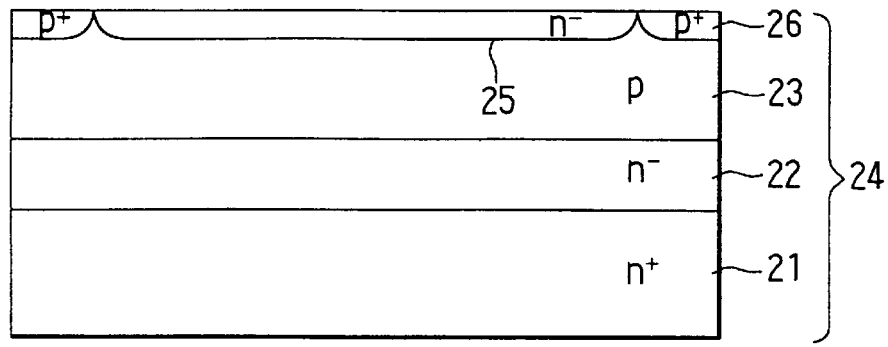

Step shown in FIG. 22

Next, the n+ type source region 25 is formed in a specific surface region of the p type epitaxial layer 23. Further, the low resistance p type silicon carbide region 26 are formed in another specific surface region of the p type epitaxial layer 23 by, for example, ion-implantation of aluminum.

Figure 23:
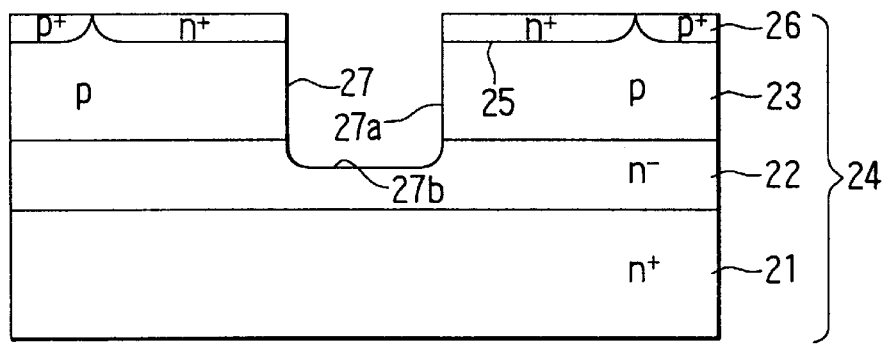

Step shown in FIG. 23

Then, the groove 27 is formed to pass through the n+ type source region 25 and the p type epitaxial layer 23, and to reach the n− type epitaxial layer 22, by a dry-etching method such as an RIE method. At that time, the side wall 27a of the groove 27 is made to be approximately parallel to the [1100] direction. The silicon carbide plane parallel to the [1100] direction has the minimum carbon atom density. Therefore, when the side wall 27a of the groove 27 are approximately parallel to the [1100] direction, the number of carbon atoms on the side wall 27a is small so that the interface state density which can be increased by carbon atoms is decreased. Because the groove 27 is formed to satisfy the above-described conditions, as shown in FIG. 20, the plane shape defined by the side wall 27a becomes a hexagon with interior angles equal to one another.

Figure 24:
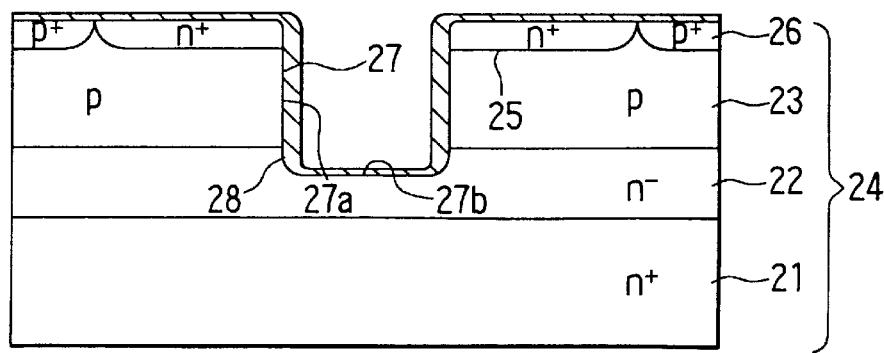

Step shown in FIG. 24

Further, the thin film semiconductor layer 28 made of n type semiconductor is formed by an epitaxial growth method not only on the upper surface of the semiconductor substrate 24 but also on inside walls (the side wall 27a and the bottom wall 27b) of the groove 27. Specifically, the n type thin film semiconductor layer 28 is homo-epitaxially grown by the CVD method on the n− type epitaxial layer 22 and the p type epitaxial layer 23, which are made of 6H-SiC, in the groove 27 to be a 6H-SiC layer. As a result, the thin film semiconductor layer 28 extends to cover the n+ type source region 25, the p type epitaxial layer 23, and the n− type epitaxial layer in the groove 27. At that time, because an epitaxial growth rate in a direction perpendicular to the (0001) carbon plane is approximately 8 to 10 times larger than that parallel to the (0001) carbon plane, the thickness of the thin film semiconductor layer 8 becomes thick on the side wall 27a and becomes thin on the bottom wall 27b.

Figure 25:
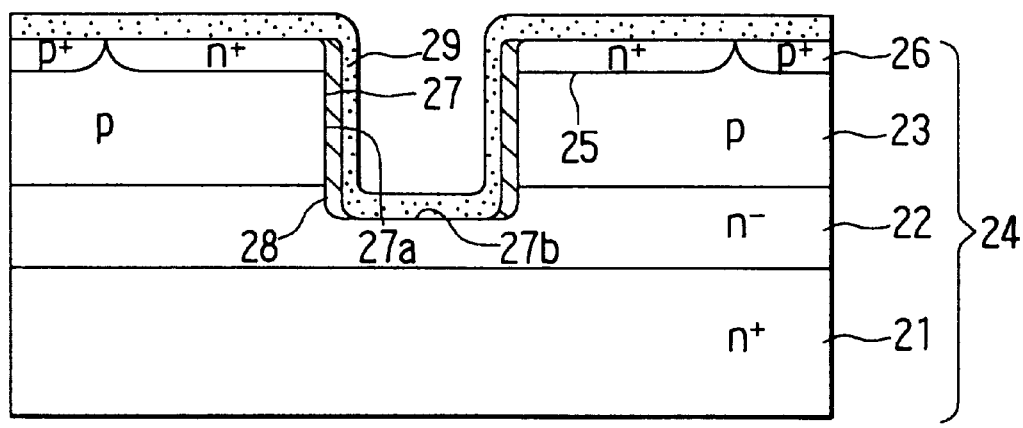

Step shown in FIG. 25

After that, the inside of the groove 27 is washed by an RCA cleaning treatment. Then, thermal oxidation is carried out in wet $O_2$ ambience at 1080° C. for 4 hours, and successively a reoxidation (post-annealing) treatment is carried out in the wet $O_2$ ambience at 950° C. for 3 hours. Accordingly, the gate oxide film (gate insulation film) 29 is formed with a thickness approximately in a range of 80 nm to 100 nm.

The interface state density at the interface between the gate oxide film 29 made of silicon dioxide, and the thin film semiconductor layer 28 and the n− type epitaxial layer 22 made of silicon carbide is controlled to be equal to or less than $4\times10^{11}$ cm$^{-2}$ eV$^{-1}$ by performing the pre-oxidation treatment such as so-called RCA cleaning, the thermal oxidation treatment, and the reoxidation treatment, especially by performing the reoxidation treatment. Incidentally, the thickness of the thus formed gate oxide film 29 becomes thin on the side wall 27a and becomes thick on the bottom wall 27b and the substrate surface. The thin film semiconductor layer 28 grown on the substrate surface and on the bottom wall 27b of the groove 27 are completely thermally-oxidized. This is because an oxidation rate of hexagonal silicon carbide is the largest on the (000$\bar{1}$) carbon plane. The oxidation rate on the (000$\bar{1}$) carbon plane is approximately 5 times larger than that on a plane perpendicular to the (000$\bar{1}$) carbon plane. As a result, the thin film semiconductor layer 28 remains only on the side wall 27a.

Figure 26:
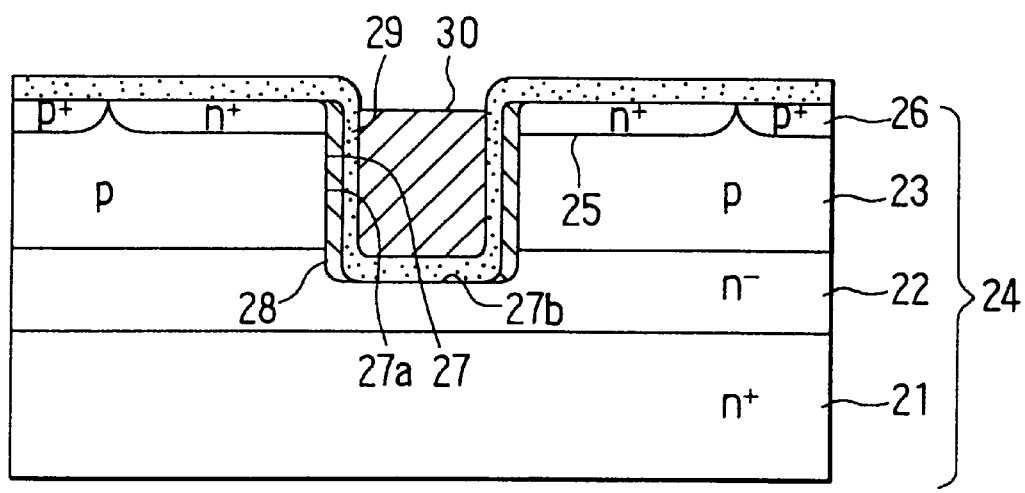

Step shown in FIG. 26

Then, the gate electrode 30 fills the inside of the gate oxide film 29 within the groove 27. The gate electrode 30 is made of p type polysilicon or n type polysilicon.

Figure 27:
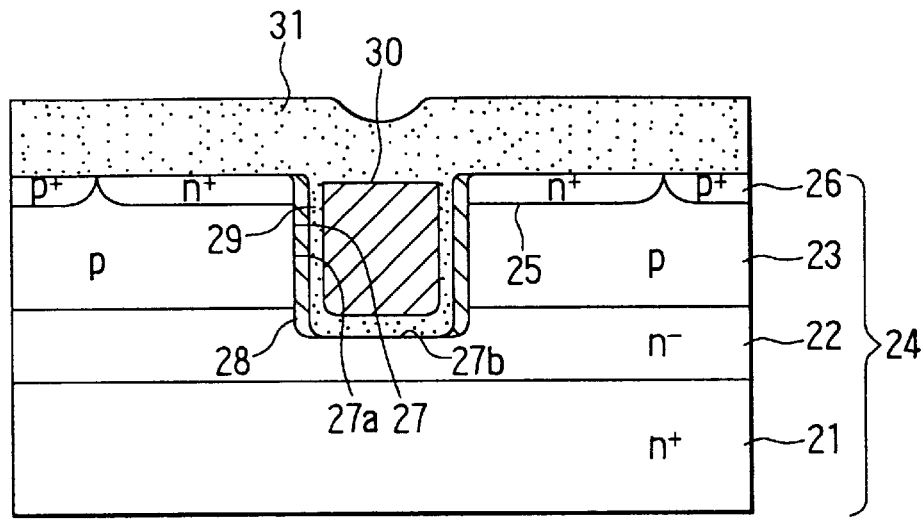

Step shown in FIG. 27

Further, the intermediate insulation layer 31 is formed on the gate electrode 30. After that, as shown in FIG. 19, the source electrode 32 is formed not only on the n$^+$ type source region 25 and the low resistance p type silicon carbide region 26 but on the intermediate insulation film 31. Further, the drain electrode 33 is formed on the surface of the n$^+$ type silicon carbide semiconductor substrate 21, thereby completing the groove gate type power MOSFET.

In the above-described embodiment, the prominent increase of the ON-resistance is prevented by appropriately controlling the interface state density, thereby preventing fluctuations in the FET characteristics. However, not only when the ON-resistance is increased but when the fixed charge density existing in the silicon dioxide region and at the silicon dioxide and silicon carbide interface is large, the FET characteristics deteriorate. That is, the large fixed charge density causes fluctuations in threshold voltage of the transistor, and accordingly leak current is produced between the drain and source electrodes even in a transistor OFF state, resulting in deterioration of the FET characteristics. Therefore, the leak current between the drain and source electrodes should be prevented from being prominently increased in the transistor OFF state.

Figure 28:
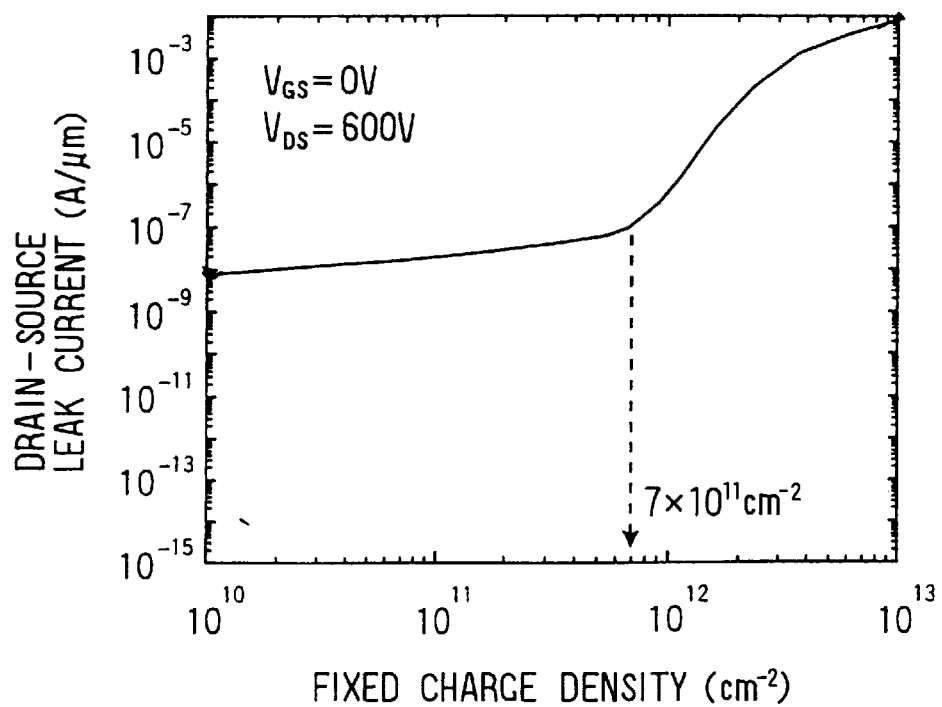
FIG. 28 is a graph showing a relationship between leak current between drain and source electrodes and fixed charge densities.

FIG. 28 shows a relationship between the fixed charge density and the leak current, which was calculated using the same simulation model shown in FIG. 16. Voltage $V_{GS}$ across the gate and source electrodes was set 0 V, and voltage $V_{DS}$ across the drain and source electrodes was set 600 V. As shown in the figure, the leak current between the drain and source electrodes in the transistor OFF state relies on the fixed charge density, and prominently increases when the fixed charge density exceeds approximately $7\times10^{11}$ cm$^{-2}$. This means that the FET characteristics become instable when the fixed charge density exceeds approximately $7\times10^{11}$ cm$^{-2}$.

Figure 29A:
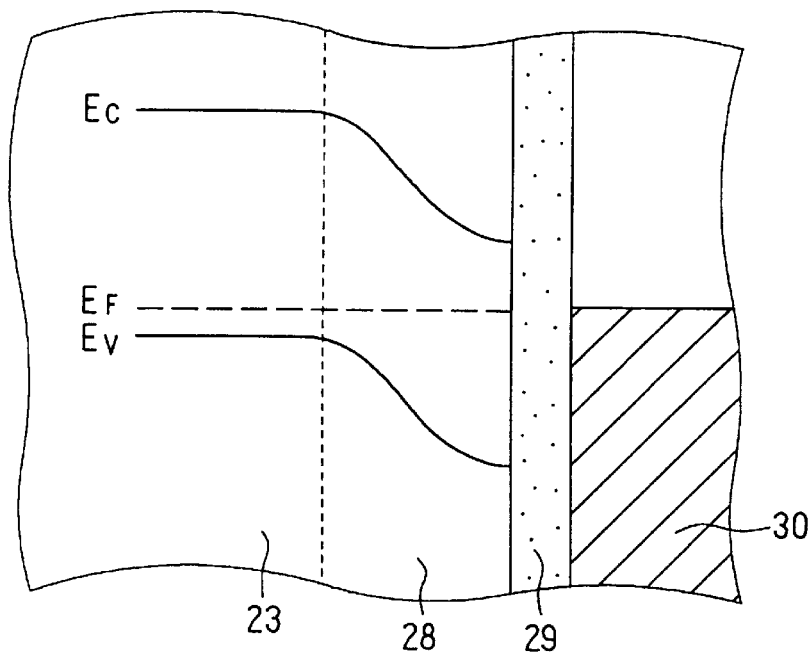
FIGS. 29A and 29B are bandgap diagrams for explaining the leak current.

The reason will be explained based on bandgap diagrams shown in FIGS. 29A and 29B indicating relationships between the fixed charge density and the leak current flow. FIG. 29A shows a case where the fixed charge density is small, e.g., where the positive fixed charge density is equal to or less than approximately $7\times10^{11}$ cm$^{-2}$. When the fixed charge density is small, energy level $E_C$ at the end of the conduction band is larger than Fermi-level $E_F$ at the silicon dioxide and silicon carbide interface. In this state, relatively small fluctuation in the fixed charge density cannot cause the leak current.

Figure 29B:
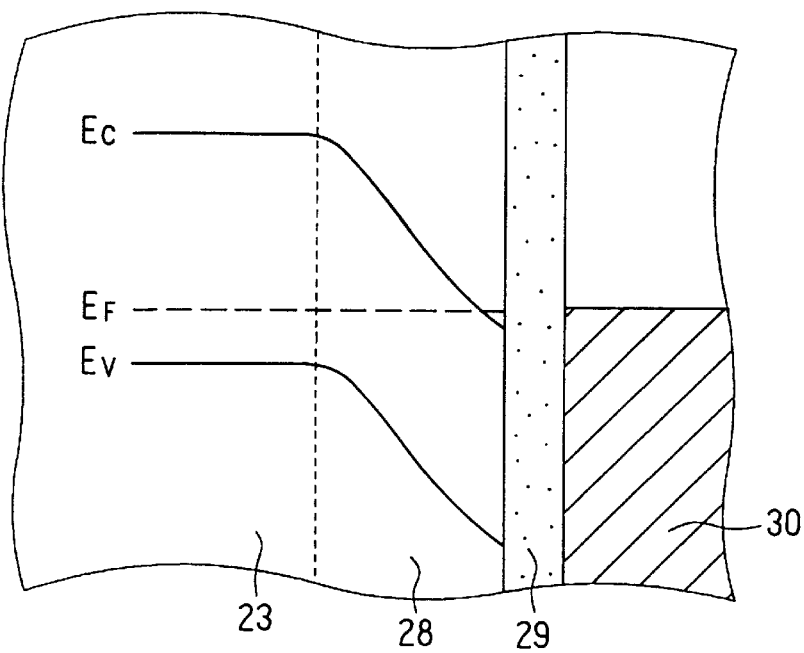

As opposed to this, in a case where the fixed charge density is large as shown in FIG. 29B, e.g., where the positive fixed charge density exceeds $7\times10^{11}$ cm$^{-2}$, energy level $E_C$ at the end of the conduction band becomes smaller than Fermi-level $E_F$ at the silicon dioxide and silicon carbide interface. In this case, the leak current flows so that the FET function does not work. Because of this, the leak current flowing between the drain and source electrodes is prevented from being prominently increased by setting the positive fixed charge density to be equal to or less than $7\times10^{11}$ cm$^{-2}$, thereby preventing fluctuation of the FET characteristics.

As shown in FIG. 17, the ON resistance increase relies on the interface state density, and is not directly related to the thicknesses and the dopant concentrations of the n$^-$ type epitaxial layer 22, the n$^+$ type source region 25, and the thin film semiconductor layer 28. Therefore, it is not always necessary to fix the thicknesses and the dopant concentrations of the above-described layers as described above. However, when the thicknesses of the n$^-$ type epitaxial layer 22, the n$^+$ type source region 25, and the thin film semiconductor layer 28 are increased, the internal resistance is increased regardless of the interface state density to increase the ON resistance. Therefore, this point should be considered to set the thicknesses.

Further, the source electrode 32 formed on the n$^+$ type source region 25 and the low resistance p type silicon carbide region 26 may be made of other materials. Furthermore, the low resistance p type silicon carbide region 26 may be omitted. In this case, the source electrode 32 is formed to contact the n$^+$ type source region 25 and the p type epitaxial layer 23. It is sufficient for the source electrode 32 to contact at least the n$^+$ source region 25.

Also, the silicon carbide semiconductor device to which the present invention is applied is not limited to the n-channel vertical MOSFET as described above, and may be a p-channel n-well type vertical MOSFET inverting p and n types shown in FIG. 19, a vertical inversion-channel type MOSFET, or the like.

Figure 30:
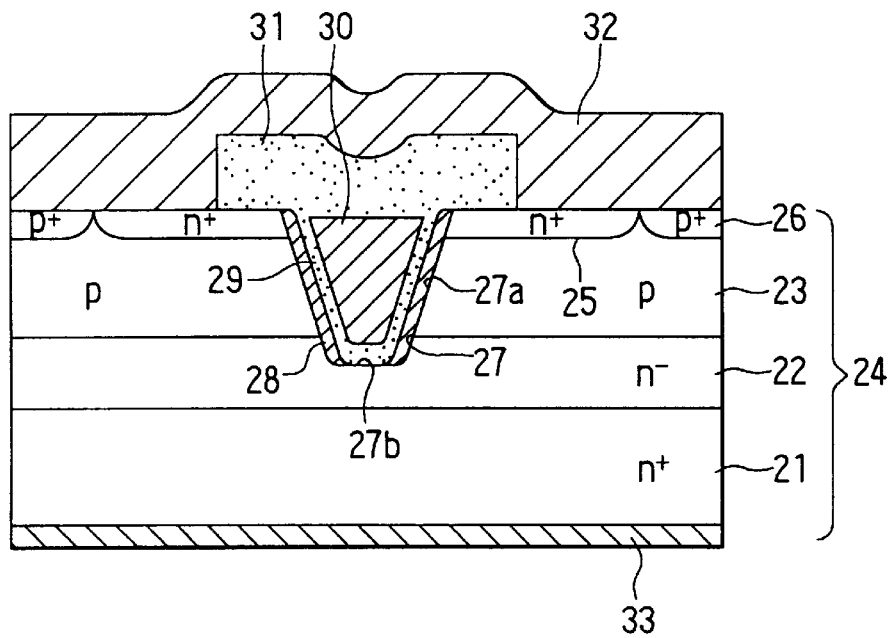
FIGS. 30 to 34 are cross-sectional views showing modified groove gate type power MOSFETs of the present invention.
Figure 31:
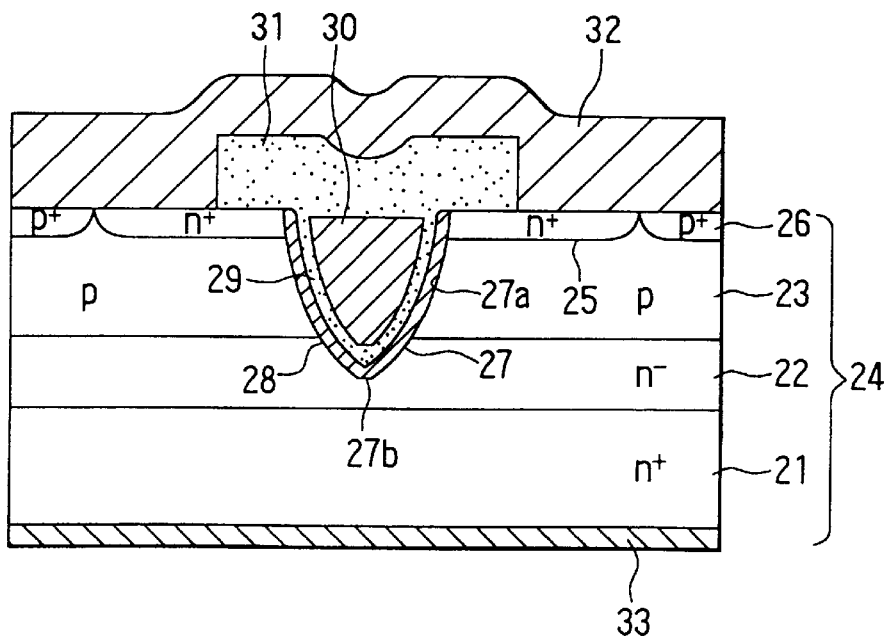

In the constitution shown in FIG. 19, the side wall 27a of the groove 27 makes an angle of approximately 90° with the surface of the semiconductor substrate 24; however, the angle may be deviated from 90°. For example, as shown in FIG. 30, the groove 27 may have a V-shaped cross section. Further, as shown in FIG. 31, the groove 27 may have smoothly curved side walls 27a without having a flat bottom wall. Incidentally, the angle defined between the side wall 27a of the groove 27 and the surface of the semiconductor substrate 24 should be designed so that the channel mobility becomes large.

Figure 32:
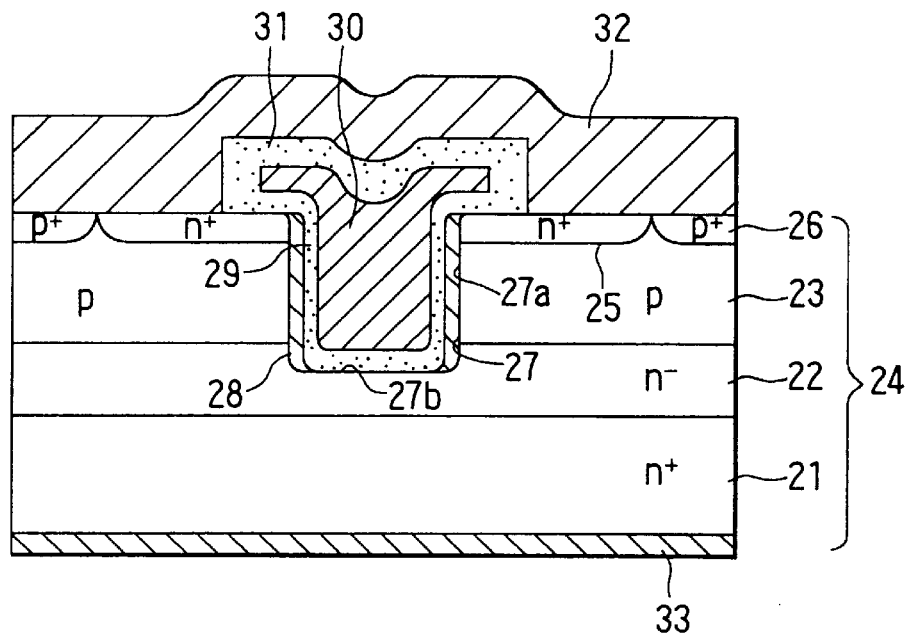
Figure 33:
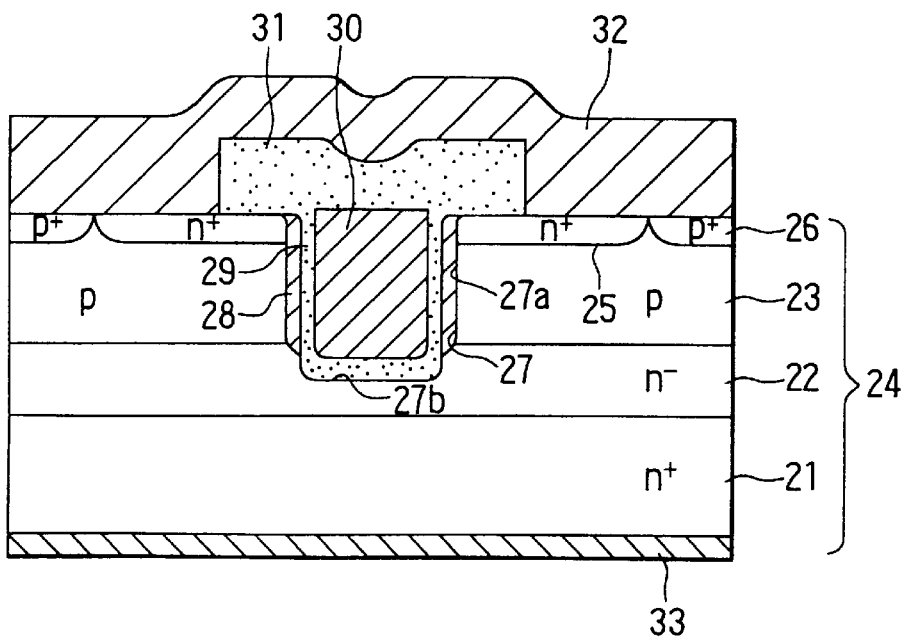

Also, as shown in FIG. 32, an upper portion of the gate electrode 30 can extend above the n$^+$ type source region 25. Accordingly, connecting resistance between the n$^+$ type source region 25 and the channel induced into the thin film semiconductor layer 28 can be reduced. Further, as shown in FIG. 33, the gate oxide film 29 may contact the central portion and the lower end of the thin film semiconductor film 28 with a constant thickness so that the gate electrode 30 extends more deeply than the lower end of the thin film semiconductor layer 28. Accordingly, connecting resistance between the channel induced into the thin film semiconductor layer 28 and the drain region can be reduced.

Figure 34:
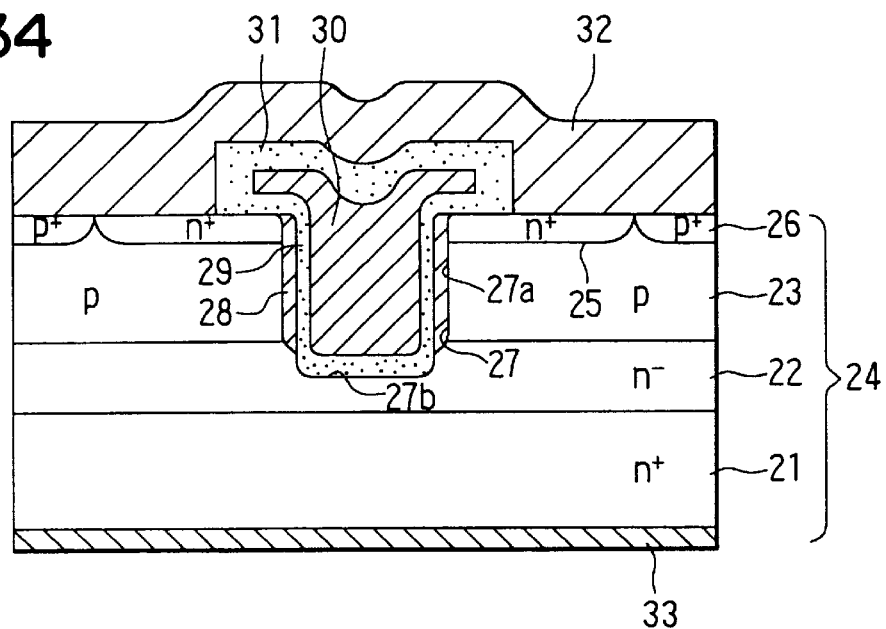

Further, as shown in FIG. 34, the upper portion of the gate electrode 30 may extend above the n$^+$ type source region 25, and simultaneously the gate electrode 30 may extend more deeply than the lower end of the thin film semiconductor layer 28 as shown in FIG. 33. The thin film semiconductor layer 28 and the p type epitaxial layer 23 may have crystal structure types different from each other. For example, when the p type epitaxial layer 23 is made of 6H-SiC and the thin film semiconductor layer 28 is made of 4H-SiC, the mobility in a carrier flowing direction is increased so that power loss of the MOSFET is reduced.

Figure 36:
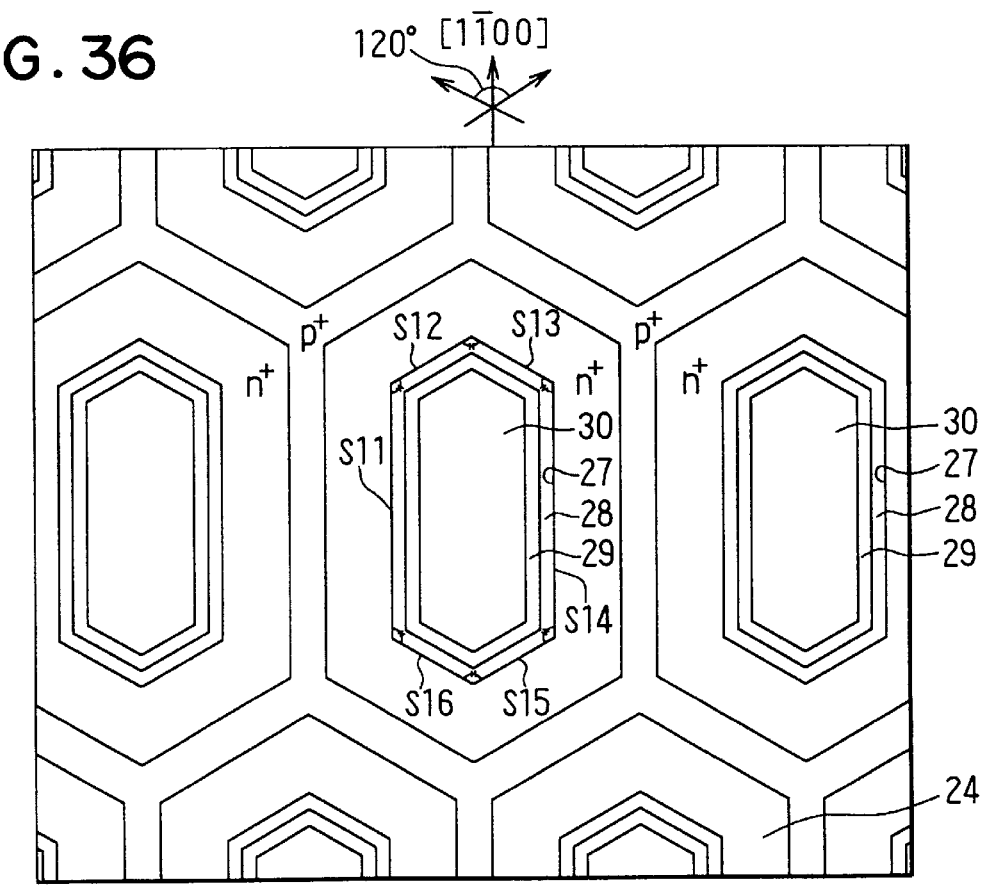
FIG. 36 is a plan view showing the MOSFET of FIG. 35.
Figure 35:
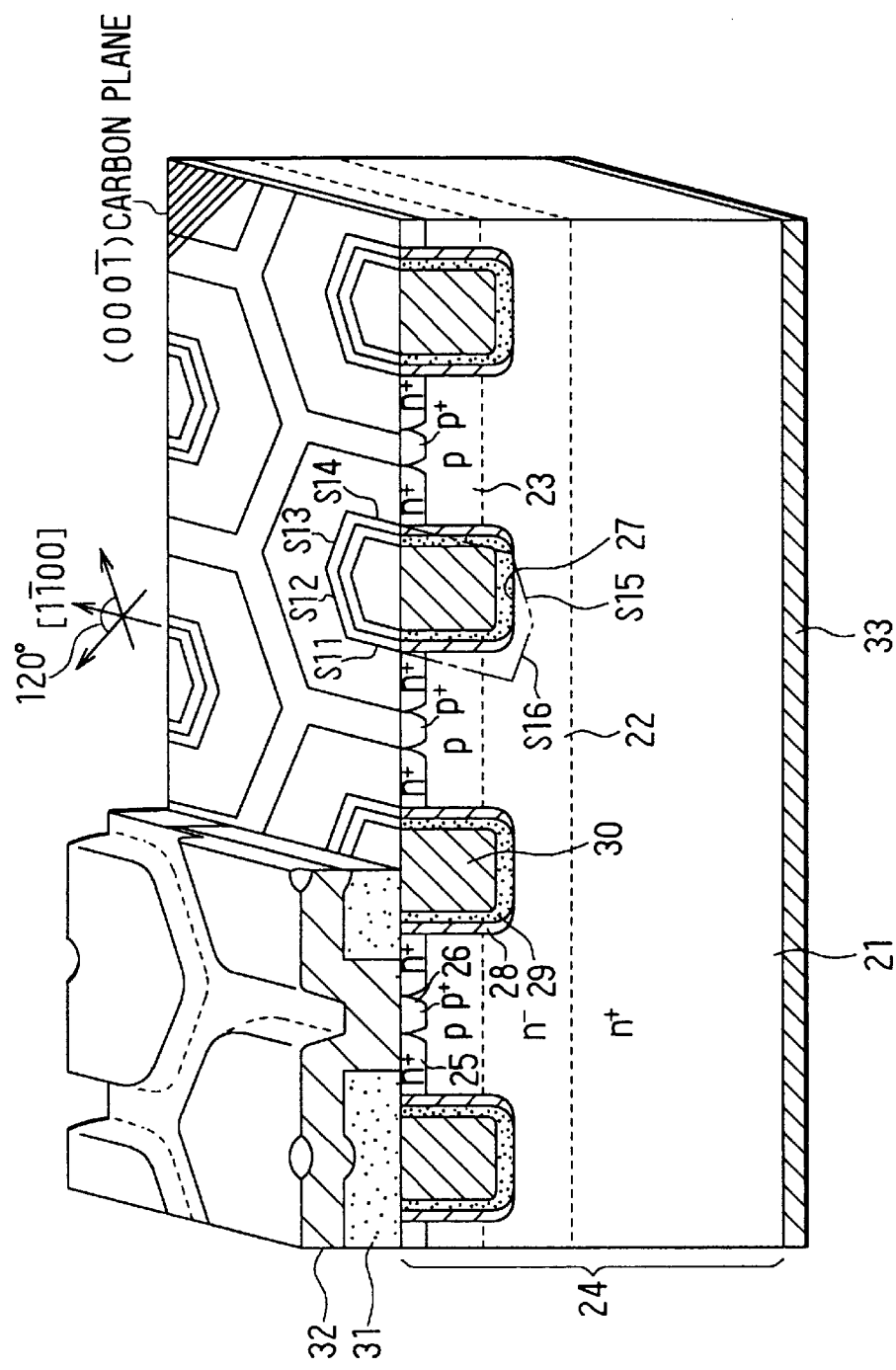
FIG. 35 is a perspective view showing another modified groove gate type power MOSFET of the present invention.

Further, as shown in FIG. 35, a plane shape defined by the side wall of the groove 27 enclosing the gate electrode may be a hexagon with interior angles approximately equal to one another. That is, as shown in FIG. 36, the hexagon has six sides S12, S13, S14, S15, and S16, and six interior angles being approximately 120°, respectively defined between the adjacent two sides.

Figure 37:
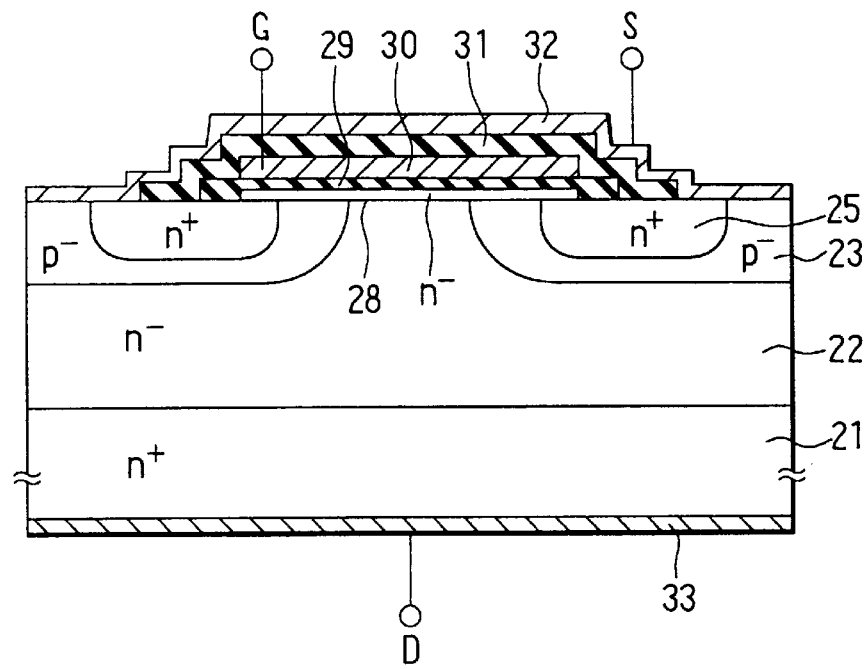
FIGS. 37 and 38 are cross-sectional views showing other modified groove gate type power MOSFETs of the present invention.

Although the side wall 27a of the groove 27 is composed of several planes approximately parallel to the [1$\bar{1}$00] direction in this embodiment; however, the direction to which the planes forming the side wall 27*a* are approximately parallel is not limited to that and may be a [11$\overline{2}$0] direction. Further, the same effects as described above can be obtained in a so-called vertical planar-type MOSFET shown in FIG. 37, in which an n type thin film semiconductor layer 28 as a channel formation layer is formed on a silicon carbide surface to provide a channel therein. In this case, the channel can be formed on the (000$\overline{1}$) carbon plane or a (0001) carbon plane. The channel formation layer may be composed of an n type layer formed by an ion-implantation method in place of the n type thin film semiconductor layer 28. A constitution in which the n type in FIG. 37 is inverted with the p type is applicable as well.

Figure 38:
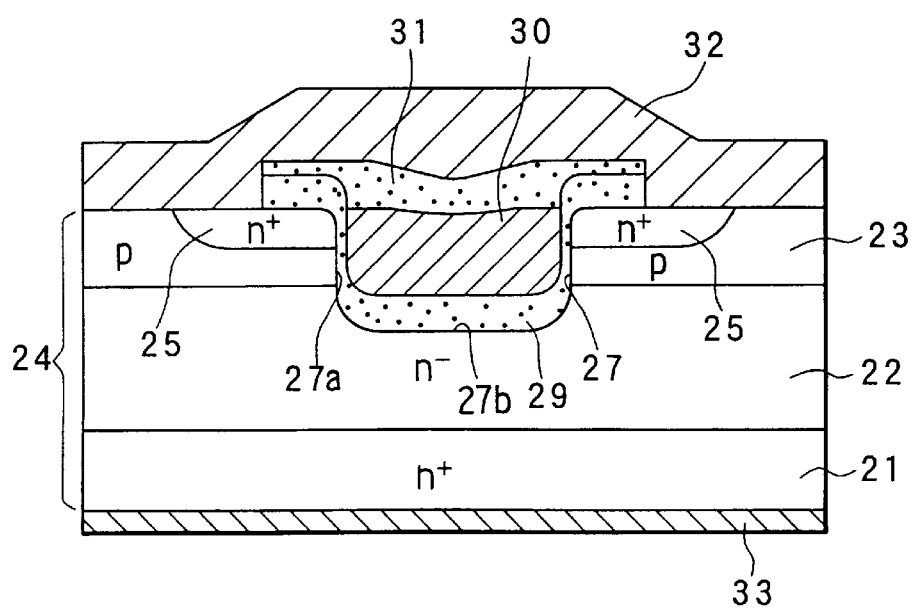

Further, FIG. 38 shows a groove gate inversion-channel type power MOSFET to which the present invention is applicable as well. In the MOSFET, it is not necessary to form the surface channel layer 28. In FIGS. 30 to 38, the parts having the same functions as those shown in FIG. 19 are indicated by the same reference numerals.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a silicon carbide semiconductor device, comprising steps of:

forming an n type semiconductor layer from silicon carbide on an n type silicon carbide semiconductor substrate to have a resistance larger than that of the n type semiconductor substrate;

forming a p type base region in a specific surface portion of the n type semiconductor layer with a first depth;

forming an n type surface channel layer on the n type semiconductor layer and on the p type base region;

forming an n type source region in a specific surface portion of the p type base region with a second depth shallower than the first depth;

forming a gate insulation film on the surface channel layer;

performing a high temperature annealing treatment at a temperature equal to or higher than 1200° C.;

forming a gate electrode on the surface channel layer through the gate insulation film interposed therebetween; and forming a source electrode to contact the n type source region and the p type base region;

forming a drain electrode on the n type silicon carbide semiconductor substrate on a side opposite the n type semiconductor layer.

2. The method of claim 1, wherein in the step of forming the gate insulation film, a heat treatment is performed at a temperature equal to or lower than 1200° C. to form the gate insulation film.

3. The method of claim 1, wherein the high temperature annealing treatment is performed in an ambience including at least one of hydrogen, oxygen, nitrogen and an inert gas.

4. A method of manufacturing a silicon carbide semiconductor device including an n type surface channel layer in which a current flows when a voltage is applied to a gate electrode, the method comprising steps of:

preparing a p type semiconductor layer;

forming the n type surface channel layer on the p type semiconductor layer, and first and second n type semiconductor regions on both sides of the n type surface channel layer so that the first and second n type semiconductor regions are connected to each other through the n type surface channel layer;

forming a gate insulation film on the n type surface channel layer by thermal oxidation;

performing a high temperature annealing treatment at a temperature equal to or higher than 1200° C.; and forming the gate electrode on the n type surface channel layer through the gate insulation film.

5. A method of manufacturing a silicon carbide semiconductor device including an n type silicon carbide semiconductor layer with a channel region in which a channel is induced when a voltage is applied to a gate electrode, the method comprising steps of:

forming first and second p type semiconductor regions on both sides of the channel region;

forming a gate insulation film on the channel region of the n type silicon carbide semiconductor layer by thermal oxidation;

performing a high temperature annealing treatment at a temperature equal to or higher than 1200° C.; and forming the gate electrode on the n type silicon carbide semiconductor layer through the gate insulation film.

6. A method of manufacturing a silicon carbide semiconductor substrate, comprising steps of:

forming an n type semiconductor layer from silicon carbide on a main surface of an n type silicon carbide semiconductor substrate to have a resistance larger than that of the n type silicon carbide semiconductor substrate;

forming a p type base region in a specific surface portion of the n type semiconductor layer with a first depth;

forming an n type surface channel layer on the n type semiconductor layer and on the p type base region;

forming an n type source region in a specific surface portion of the p type base region with a second depth shallower than the first depth of the p type base region;

forming a gate insulation film on the n type surface channel layer by thermally oxidizing a surface portion of the n type surface channel layer at a first temperature;

performing a reoxidation annealing in an oxidation ambience at a second temperature lower than the first temperature;

performing an annealing at an oxidation rate smaller than that in the reoxidation annealing;

forming a gate electrode on the gate insulation film;

forming a source electrode to contact the n type source region and the p type base region; and forming a drain electrode on a back surface of the n type semiconductor substrate opposite the main surface.

7. The method of claim 6, wherein the annealing is performed in an ambience including oxygen.

8. The method of claim 7, wherein the annealing is performed in the ambience including oxygen and an inert gas.

9. The method of claim 6, wherein the oxidation rate in the annealing is equal to or less than 0.8 nm/h.

10. The method of claim 6, wherein the annealing is performed at a third temperature approximately equal to the second temperature of the reoxidation annealing.

* * * * *